US008835234B2

(12) United States Patent
Chidambarrao et al.

(10) Patent No.: US 8,835,234 B2
(45) Date of Patent: Sep. 16, 2014

(54) MOS HAVING A SIC/SIGE ALLOY STACK

(71) Applicant: International Business Machines Corporation, Armonk, NY (US)

(72) Inventors: Dureseti Chidambarrao, Weston, CT (US); Brian J. Greene, Wappingers Falls, NY (US); Yue Liang, San Jose, CA (US); Xiaojun Yu, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 13/916,925

(22) Filed: Jun. 13, 2013

(65) Prior Publication Data

US 2013/0273699 A1 Oct. 17, 2013

Related U.S. Application Data

(62) Division of application No. 13/343,472, filed on Jan. 4, 2012, now Pat. No. 8,475,706.

(51) Int. Cl.
*H01L 21/8238* (2006.01)
*H01L 27/12* (2006.01)
*H01L 21/84* (2006.01)
*H01L 29/66* (2006.01)
*H01L 29/10* (2006.01)

(52) U.S. Cl.
CPC ........ *H01L 21/8238* (2013.01); *H01L 27/1203* (2013.01); *H01L 21/84* (2013.01); *H01L 21/823807* (2013.01); *H01L 29/66651* (2013.01); *H01L 29/1054* (2013.01)
USPC .......................................... 438/153; 438/142

(58) Field of Classification Search
USPC ...................... 257/338, 77, 192; 438/199, 142
See application file for complete search history.

(56) References Cited

U.S. PATENT DOCUMENTS 5,360,986 A  11/1994  Candelaria
5,561,302 A  10/1996  Candelaria (Continued)

OTHER PUBLICATIONS

Ernst, T. et al., "Fabrication of a Novel Strained SiGe:C-channel Planar 55nm nMOSFET for High-Performance CMOS" IEEE Symposium on VLSI Technology Digest of Technical Papers (2002) pp. 92-93, vol. 10.1.

(Continued)

*Primary Examiner* — Telly Green
*Assistant Examiner* — Damian A Hillman
(74) *Attorney, Agent, or Firm* — Scully, Scott, Murphy & Presser, P.C.; Joseph P. Abate, Esq.

(57) ABSTRACT

A delta doping of silicon by carbon is provided on silicon surfaces by depositing a silicon carbon alloy layer on silicon surfaces, which can be horizontal surfaces of a bulk silicon substrate, horizontal surfaces of a top silicon layer of a semiconductor-on-insulator substrate, or vertical surfaces of silicon fins. A p-type field effect transistor (PFET) region and an n-type field effect transistor (NFET) region can be differentiated by selectively depositing a silicon germanium alloy layer in the PFET region, and not in the NFET region. The silicon germanium alloy layer in the PFET region can overlie or underlie a silicon carbon alloy layer. A common material stack can be employed for gate dielectrics and gate electrodes for a PFET and an NFET. Each channel of the PFET and the NFET includes a silicon carbon alloy layer, and is differentiated by the presence or absence of a silicon germanium layer.

20 Claims, 18 Drawing Sheets

(56) References Cited

U.S. PATENT DOCUMENTS

| | | | |
|---|---|---|---|
| 6,358,806 B1 | 3/2002 | Puchner | |
| 6,995,397 B2 | 2/2006 | Yamashita et al. | |
| 7,446,350 B2 | 11/2008 | Chen et al. | |
| 7,521,776 B2 | 4/2009 | Cannon et al. | |
| 7,615,418 B2 | 11/2009 | Chidambarrao et al. | |
| 7,691,698 B2 | 4/2010 | Chidambarrao et al. | |
| 7,696,000 B2 | 4/2010 | Liu et al. | |
| 7,755,171 B2 | 7/2010 | Zhu | |
| 7,859,044 B2* | 12/2010 | Wong et al. | 257/316 |
| 7,968,910 B2 | 6/2011 | Chen et al. | |
| 7,977,712 B2 | 7/2011 | Zhu et al. | |
| 8,017,489 B2 | 9/2011 | Clark, Jr. et al. | |
| 2007/0148939 A1* | 6/2007 | Chu et al. | 438/590 |
| 2008/0096330 A1 | 4/2008 | Doris et al. | |
| 2008/0258220 A1 | 10/2008 | Bedell et al. | |
| 2008/0280404 A1 | 11/2008 | Chudzik et al. | |
| 2009/0173967 A1 | 7/2009 | Hamaguchi et al. | |
| 2010/0213553 A1 | 8/2010 | Hargrove et al. | |
| 2010/0224938 A1 | 9/2010 | Zhu | |
| 2010/0289088 A1 | 11/2010 | Li et al. | |
| 2011/0104878 A1 | 5/2011 | Beyer et al. | |
| 2012/0132998 A1 | 5/2012 | Kwon et al. | |
| 2012/0138953 A1 | 6/2012 | Cai et al. | |
| 2012/0199910 A1 | 8/2012 | Cheng | |

OTHER PUBLICATIONS

Ernst, T. et al., "A New Si:C Epitaxial Channel nMOSFET Architecture with Improved Drivability and Short-Channel Characteristics" IEEE Symposium on VLSI Technology Digest of Technical Papers (2003) pp. 51-52, vol. 5A-2.

Ban, I. et al., "Supression of Oxidation-Enhanced Boron Diffusion in Silicon by Carbon Implantation and Characterization of MOSFET's with Carbon-Implanted Channels" IEEE Transactions on Electron Devices (Sep. 1997) pp. 1544-1551, vol. 44, No. 9.

Hokazono, A. et al., "Steep Channel & Halo Profiles Utilizing Boron-Diffusion-Barrier Layers (Si:C) for 32nm Node and Beyond" IEEE Symposium on VLSI Technology Digest of Technical Papers (2008) pp. 112-113.

* cited by examiner

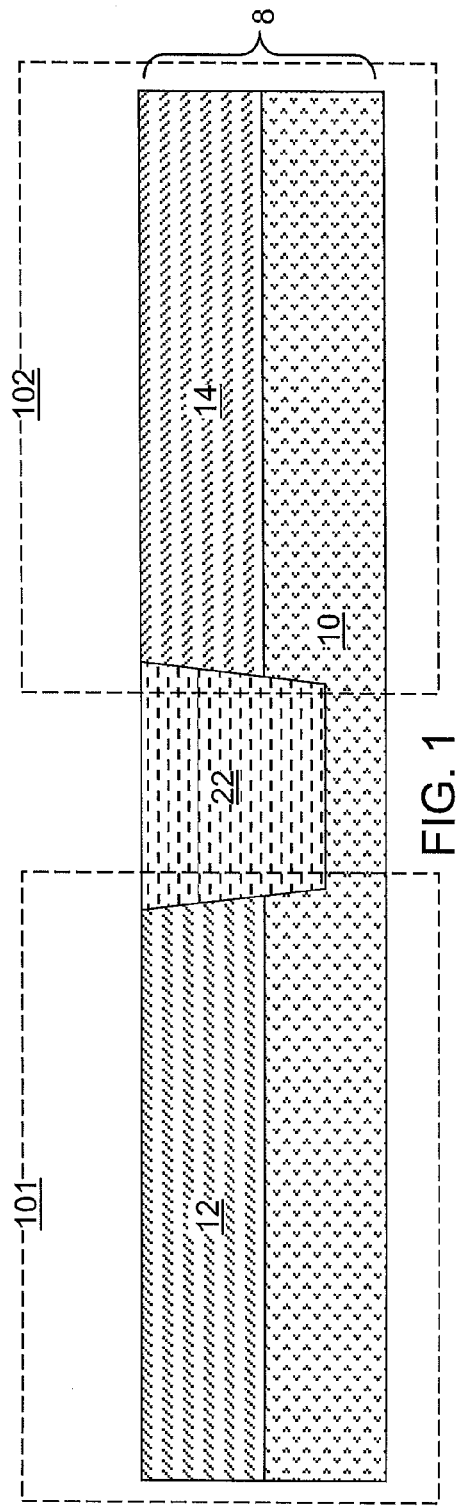
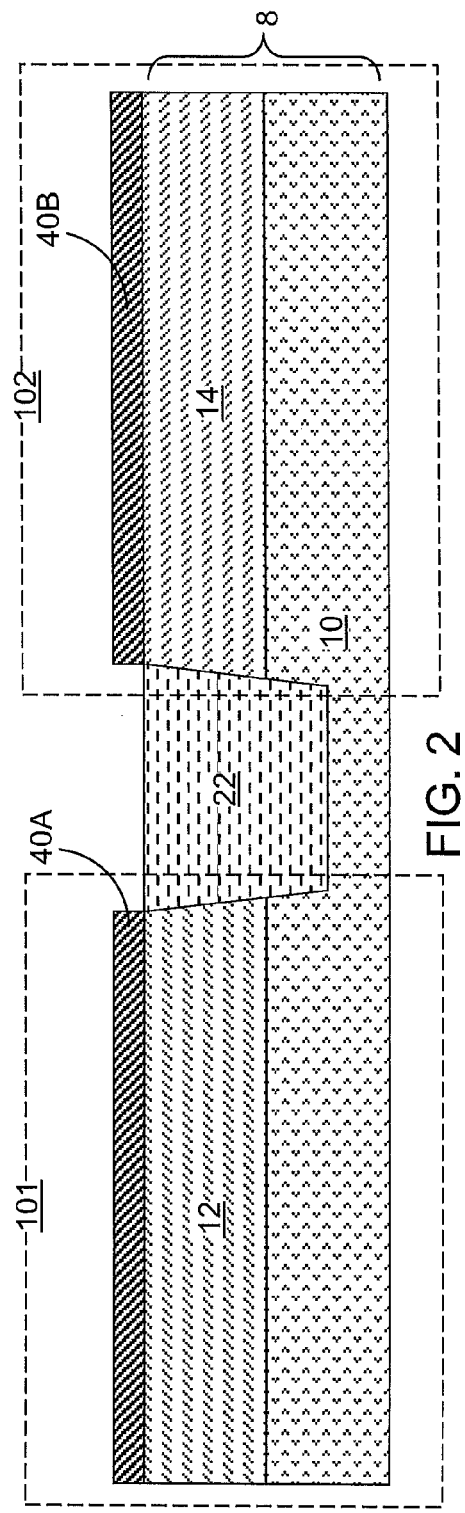

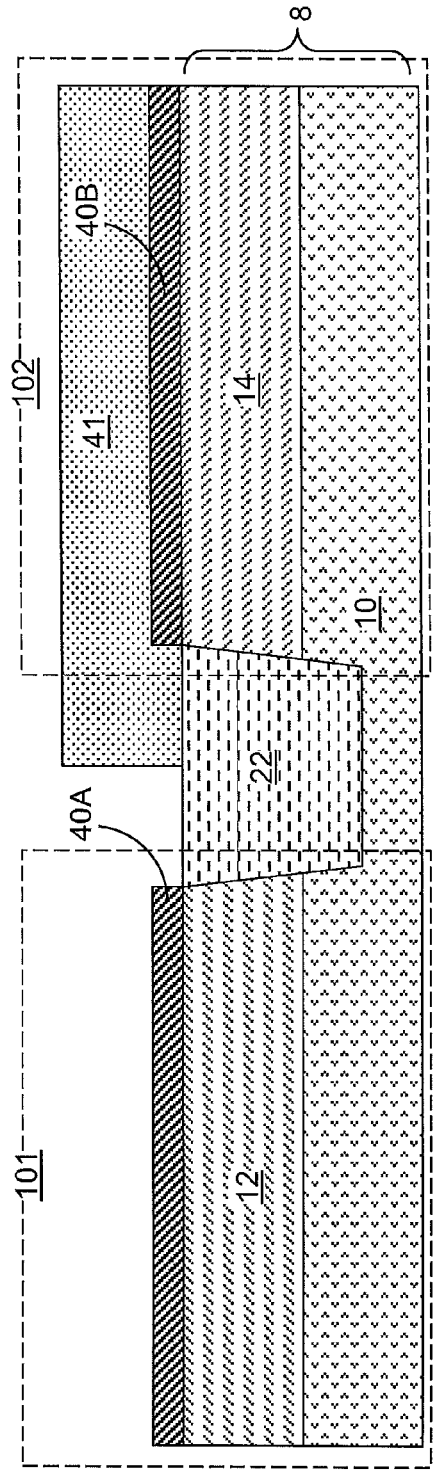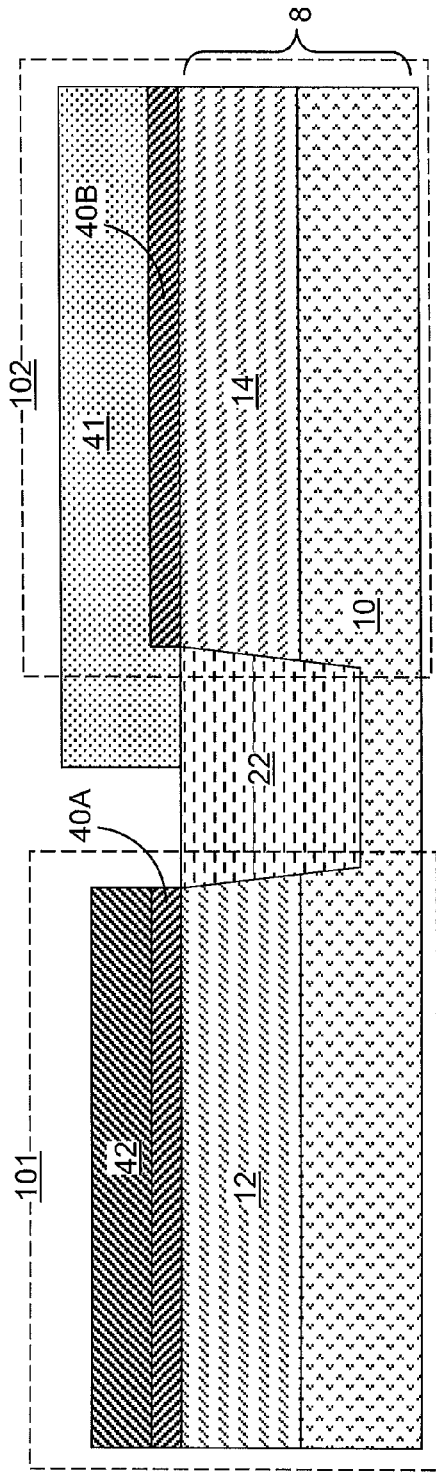

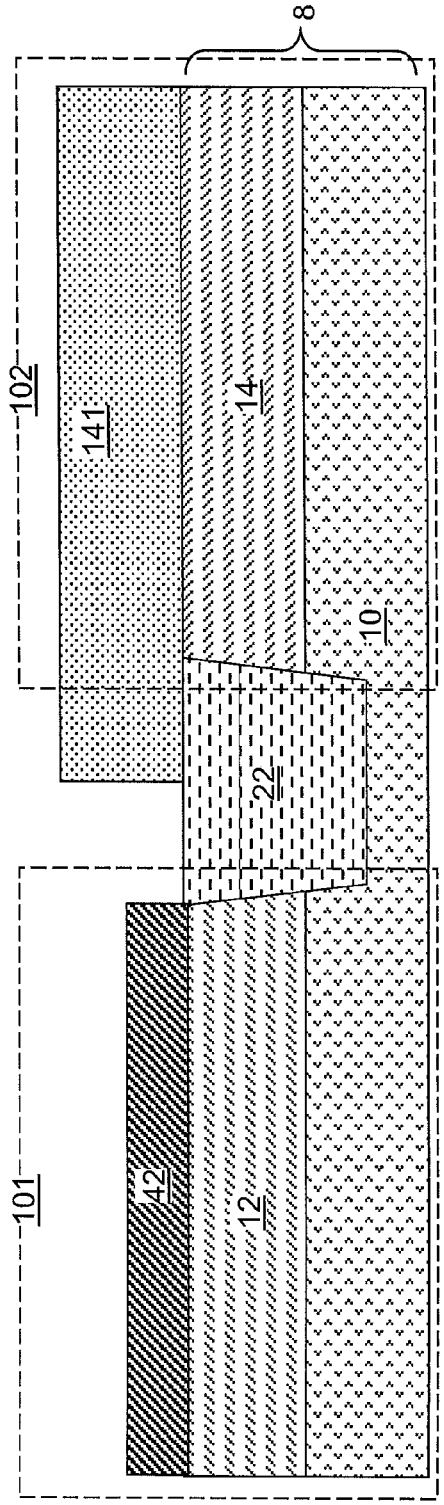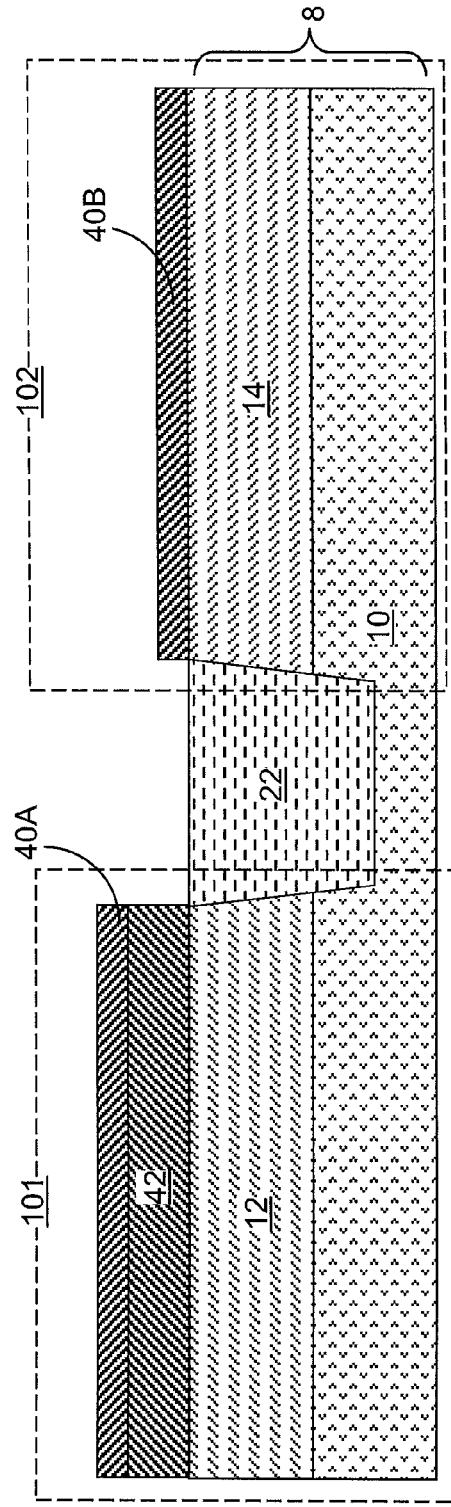

MOS HAVING A SIC/SIGE ALLOY STACK

CROSS REFERENCE TO RELATED APPLICATION

This application is a divisional of U.S. patent application Ser. No. 13/343,472, filed on Jan. 4, 2012, the entire content and disclosure of which are incorporated herein by reference.

BACKGROUND

The present disclosure relates to semiconductor structures, and more particularly to planar and fin field effect transistor (FET) structures having a thin silicon carbon alloy layer in a channel, and methods of manufacturing the same.

In some processing schemes for manufacturing complementary metal oxide semiconductor (CMOS) devices employing a high dielectric constant (high-k) gate dielectric material and a metallic gate electrode material, the gate workfunction of n-type field effect transistors (NFETs) is tuned by addition of lanthanum at a bottommost layer of a gate electrode, while the gate workfunction of p-type field effect transistors (PFETs) is determined by the material composition of the gate electrode that does not include added lanthanum. The greater the amount of lanthanum that is added to a gate electrode of an NFET, the greater the shift of the gate workfunction to the valence band edge of silicon. However, addition of lanthanum degrades the mobility of charge carriers (electrons) in the channel of the NFET. The degradation of the minority carrier mobility in the channel of the NFET is proportional to the amount of lanthanum added to the gate electrode of the NFET. Thus, a significant undesirable side effect of degradation of charge carrier mobility accompanies the addition of lanthanum to alter the gate workfunction in an NFET.

Another approach to match the gate workfunction of NFETs to the valence band edge of an underlying silicon-based material is to implant carbon at a concentration that preserves the crystallinity of the underlying silicon-based material. The atomic concentration of carbon is less than 1.0% in a silicon carbon alloy formed by implantation of carbon into single crystalline silicon. While such implantation of carbon demonstrated a significant benefit for shifting the workfunction of a carbon-implanted channel, the carbon implantation introduces carbon atoms into shallow trench isolation structures. The shallow trench isolation structures include silicon oxide, and when implanted with carbon, the silicon oxide of the shallow trench isolation structures becomes a carbon-doped silicon oxide. Carbon-doped silicon oxide is more susceptible to wet etches or clean chemistries employed throughout semiconductor manufacturing sequences. Particularly, the loss of the carbon-doped silicon oxide material in the shallow trench isolation structures during a reactive ion etch employed for gate patterning is significant, and results in a height variation of shallow trench isolation structures, pull-down of gate conductor materials, and electrical shorts of various semiconductor components through strips of residual gate conductor materials deposited in divots. In addition, because the energy of ion implantation cannot be precisely controlled for shallow implantation, any carbon implanted structure has a thickness greater than 5 nm, making the carbon implantation method unusable for extremely thin semiconductor-on-insulator (ETSOI) structures in which the entire thickness of a top semiconductor layer is on the order of 5 nm. Thus, use of carbon implantation to form carbon-doped silicon material is impractical for many applications.

BRIEF SUMMARY

A delta doping of silicon by carbon is provided on silicon surfaces by depositing a silicon carbon alloy layer on silicon surfaces, which can be horizontal surfaces of a bulk silicon substrate, horizontal surfaces of a top silicon layer of a semiconductor-on-insulator substrate, or vertical surfaces of silicon fins. A p-type field effect transistor (PFET) region and an n-type field effect transistor (NFET) region can be differentiated by selectively depositing a silicon germanium alloy layer in the PFET region, while not forming a silicon germanium alloy layer in the NFET region. The silicon germanium alloy layer in the PFET region can overlie or underlie a silicon carbon alloy layer. A common material stack can be employed for gate dielectrics and gate electrodes for a PFET and an NFET. Each channel of the PFET and the NFET includes a silicon carbon alloy layer, and is differentiated by the presence or absence of a silicon germanium layer.

According to an aspect of the present disclosure, a semiconductor structure includes a p-type field effect transistor (PFET) and an n-type field effect transistor (NFET) located on a substrate. The PFET includes a first silicon portion and a layer stack of a first silicon carbon alloy layer and a silicon germanium alloy layer, a combination of the first silicon portion and the layer stack includes a first source region, a first drain region, and a first body region, and the layer stack is in contact with a first gate dielectric that is in contact with a first gate electrode. The NFET includes a second silicon portion and a second silicon carbon alloy layer, a combination of the second silicon portion and the second silicon carbon alloy layer includes a second source region, a second drain region, and a second body region, and the second silicon carbon alloy layer is in contact with a second gate dielectric that is in contact with a second gate electrode. The first gate dielectric and the second gate dielectric have a same composition and a same thickness.

According to another aspect of the present disclosure, a method of forming a semiconductor structure including a p-type field effect transistor (PFET) and an n-type field effect transistor (NFET) is provided. The method includes: forming a layer stack of a first silicon carbon alloy layer and a silicon germanium alloy layer on a first silicon portion of a substrate; forming a second silicon carbon alloy layer on a second silicon portion of the substrate; forming a gate stack of a gate dielectric layer and a gate electrode layer on a portion of the layer stack and on a portion of the second silicon carbon alloy layer; patterning the gate stack to form a first gate dielectric and a first gate electrode of a p-type field effect transistor (PFET) and a second gate dielectric and a second gate electrode of an n-type field effect transistor (NFET); forming a first source region and a first drain region of the PFET by implanting p-type dopants into portions of the layer stack and the first silicon portion; and forming a second source region and a second drain region of the NFET by implanting n-type dopants into portions of the second silicon carbon layer and the second silicon portion.

BRIEF DESCRIPTION OF SEVERAL VIEWS OF THE DRAWINGS

FIG. 1 is a vertical cross-sectional view of a first exemplary semiconductor structure after formation of a shallow trench isolation structure according to a first embodiment of the present disclosure.

FIG. 2 is a vertical cross-sectional view of the first exemplary semiconductor structure after formation of first and second silicon carbon alloy layers according to the first embodiment of the present disclosure.

FIG. 3 is a vertical cross-sectional view of the first exemplary semiconductor structure after deposition and patterning of a dielectric masking layer according to the first embodiment of the present disclosure.

FIG. 4 is a vertical cross-sectional view of the first exemplary semiconductor structure after formation of a silicon germanium alloy layer according to the first embodiment of the present disclosure.

FIG. 8 is a vertical cross-sectional view of a third exemplary semiconductor structure after formation of a silicon germanium alloy layer according to a third embodiment of the present disclosure.

FIG. 9 is a vertical cross-sectional view of the third exemplary semiconductor structure after formation of first and second silicon carbon alloy layers according to the third embodiment of the present disclosure.

DETAILED DESCRIPTION

Figure 5:
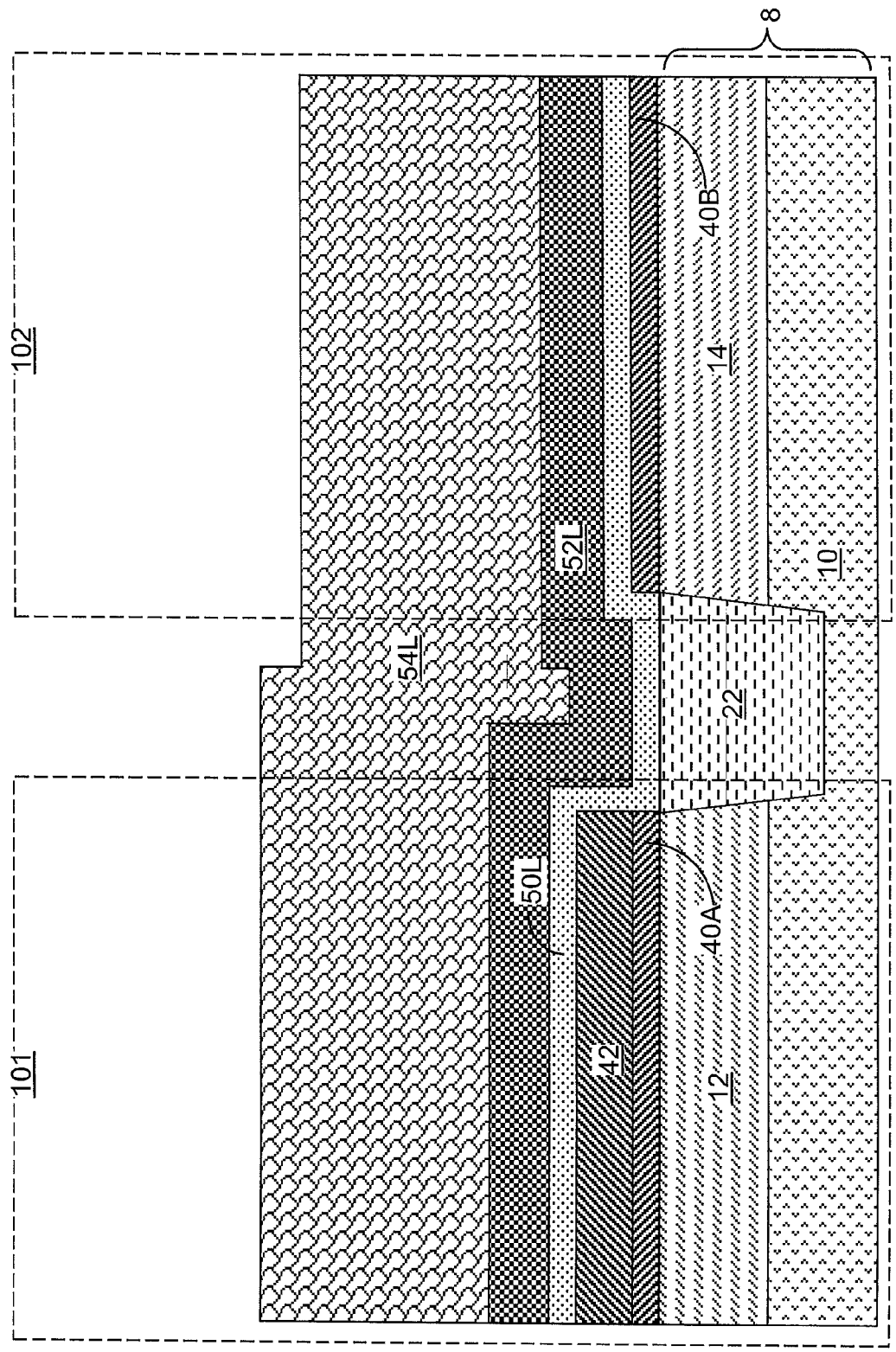
FIG. 5 is a vertical cross-sectional view of the first exemplary semiconductor structure after formation of a gate dielectric layer and a gate electrode layer according to the first embodiment of the present disclosure.

As stated above, the present disclosure relates to planar and fin field effect transistor (FET) structures having a thin silicon carbon alloy layer in a channel, and methods of manufacturing the same, which are now described in detail with accompanying figures. It is noted that like and corresponding elements are referred to by like reference numerals. Further, references to a singular element apply to a plurality of elements identified by the same reference numerals, and vice versa.

Referring to FIG. 1, a first exemplary semiconductor structure according to a first embodiment of the present disclosure includes a substrate 8, which can be a bulk semiconductor substrate including at least one semiconductor material that contiguously extends from the topmost surface of the substrate 8 to a bottommost surface of the substrate 8. The substrate 8 includes a semiconductor material layer 10 having a semiconductor material. The semiconductor material of the semiconductor material layer 10 can be, for example, single crystalline silicon, a single crystalline silicon germanium alloy, or a single crystalline silicon carbon alloy.

An n-type well 12 including a silicon-containing semiconductor material and n-type dopants is formed in a region of the substrate 8, which is herein referred to as a p-type field effect transistor (PFET) region 101. The n-type well 12 can include n-doped single crystalline silicon. In one embodiment, the n-type well 12 can be formed by providing a single crystalline silicon substrate, and implanting n-type dopants into an upper portion of the single crystalline silicon substrate. The thickness of the n-type well 12 can be from 50 nm to 2,000 nm, although lesser and greater thicknesses can also be employed. The n-type well 12 is a first silicon portion, i.e., a first portion that includes silicon as the only semiconductor material therein.

A p-type well 14 including a silicon-containing semiconductor material and p-type dopants is formed in another region of the substrate 8, which is herein referred to as an n-type field effect transistor (NFET) region 102. The p-type well 14 can include p-doped single crystalline silicon. In one embodiment, the p-type well 14 can be formed by providing a single crystalline silicon substrate, and implanting p-type dopants into an upper portion of the single crystalline silicon substrate. The thickness of the p-type well 14 can be from 50 nm to 2,000 nm, although lesser and greater thicknesses can also be employed. The p-type well 14 is a second silicon portion, i.e., a second portion that includes silicon as the only semiconductor material therein.

A shallow trench isolation structure 22 can be formed in an upper portion of the substrate 8. The shallow trench isolation structure 22 includes a dielectric material such as silicon oxide, silicon nitride, silicon oxynitride, or a combination thereof. In one embodiment, carbon is not added in a deposition process that forms the shallow trench isolation structure 22. In one embodiment, the atomic carbon concentration in the shallow trench isolation structure 22 is less than 0.1%. In one embodiment, the atomic carbon concentration in the shallow trench isolation structure 22 is less than 1 p.p.m. (parts per million). In one embodiment, the shallow trench isolation structure 22 includes silicon oxide that is substantially free of carbon. As used herein, an element is "substantially free of carbon" if the carbon content of the element is less than 0.01% in atomic concentration.

In one embodiment, the shallow trench isolation structure 22 includes silicon oxide as the dielectric material therein. As such, the shallow trench isolation structure 22 is a silicon oxide material portion located within the substrate 8. The shallow trench isolation structure 22 is laterally in contact with the n-type well 12 and the p-type well 14, and can be substantially free of carbon. The depth of the shallow trench isolation structure 22, as measured from the top surface of the shallow trench isolation structure 22 to the bottom surface of the shallow trench isolation structure 22, can be greater than the thicknesses of the n-type well 12 and the p-type well 14. In one embodiment, the top surface of the shallow trench isolation structure 22 can be substantially coplanar with the top surfaces of the n-type well 12 and the p-type well 14.

After the processing steps of FIG. 1, a layer stack of a first silicon carbon alloy layer and a silicon germanium alloy layer is formed on the top surface of the n-type well 12, and a second silicon carbon alloy layer is formed on the top surface of the p-type well 14.

Referring to FIG. 2, a first silicon carbon alloy layer 40A and a second silicon carbon alloy layer 40B are formed by deposition of a silicon carbon alloy material on a horizontal top surface of the n-type well 12 and on a horizontal top surface of the p-type well 14, respectively.

The silicon carbon alloy material can be deposited by a selective deposition process, such as selective epitaxy, in which the silicon carbon alloy material nucleates, and is deposited, on semiconductor surfaces, while the silicon carbon alloy material does not nucleate, and is not deposited, on dielectric surfaces. Selective deposition of the silicon carbon alloy material can be effected, for example, by concurrently or alternatively flowing reactant gases that are precursors for the deposited silicon carbon alloy material and an etchant gas. Optionally, a carrier gas such as $H_2$, $N_2$, or Ar can be employed. The reactant gases include a silicon precursor gas such as $SiH_4$, $SiH_2Cl_2$, $SiHCl_3$, $SiCl_4$, $Si2H_6$, or combinations thereof, and a carbon precursor gas such as $CH_4$, $C_2H_2$, $C_2H_4$, $C_2H_6$, or combinations thereof. The etchant gas can be, for example, HCl, which can be provided as a separate gas or generated from a chlorine-containing reactant gas as a byproduct.

The first silicon carbon alloy layer 40A and the second silicon carbon alloy layer 40B are formed simultaneously, i.e., in a same deposition process. The first silicon carbon alloy layer 40A and the second silicon carbon alloy layer 40B can have the same thickness and the same carbon concentration profile.

In one embodiment, the carbon concentration profile in the first and second silicon carbon alloy layers (40A, 40B) can include a delta doping profile. As used herein, a delta doping profile is a profile in which a concentration change from the peak concentration to 10% of the peak concentration occurs within 1 nm.

In one embodiment, the same thickness of the first and second silicon carbon alloy layers (40A, 40B) can be less than 2.0 nm, as measured by the thickness of the deposited silicon carbon alloy material. The carbon concentration profile, which is the same across the first and second silicon carbon alloy layers (40A, 40B); can have an atomic carbon concentration between 0.1% and 50% at a peak concentration thereof.

In one embodiment, the atomic carbon concentration within the deposited material of the first and second silicon carbon alloy layers (40A, 40B) can be greater than 0.1%. In one embodiment, the atomic carbon concentration within the deposited material of the first and second silicon carbon alloy layers (40A, 40B) can be greater than 0.5%. In one embodiment, the atomic carbon concentration within the deposited material of the first and second silicon carbon alloy layers (40A, 40B) can be greater than 2.0%. In one embodiment, the atomic carbon concentration within the deposited material of the first and second silicon carbon alloy layers (40A, 40B) can be greater than 5.0%. In one embodiment, the atomic carbon concentration within the deposited material of the first and second silicon carbon alloy layers (40A, 40B) can be greater than 10.0%. In one embodiment, the atomic carbon concentration within the deposited material of the first and second silicon carbon alloy layers (40A, 40B) can be greater than 20%.

In one embodiment, the atomic carbon concentration within the deposited material of the first and second silicon carbon alloy layers (40A, 40B) can be less than 50%. In one embodiment, the atomic carbon concentration within the deposited material of the first and second silicon carbon alloy layers (40A, 40B) can be less than 40%. In one embodiment, the atomic carbon concentration within the deposited material of the first and second silicon carbon alloy layers (40A, 40B) can be greater than 25%. In one embodiment, the atomic carbon concentration within the deposited material of the first and second silicon carbon alloy layers (40A, 40B) can be greater than 10%. In one embodiment, the atomic carbon concentration within the deposited material of the first and second silicon carbon alloy layers (40A, 40B) can be greater than 5%. In one embodiment, the atomic carbon concentration within the deposited material of the first and second silicon carbon alloy layers (40A, 40B) can be greater than 2%.

In one embodiment, the first silicon carbon alloy layer 40A and the second silicon carbon alloy layer 40B can include a single crystalline silicon carbon alloy material that is epitaxially aligned to an underlying silicon-containing single crystalline semiconductor material. Specifically, the first silicon carbon alloy layer 40A can include a single crystalline silicon carbon alloy material that is epitaxially aligned to an n-doped single crystalline silicon material within the n-type well 12, and the second silicon carbon alloy layer 40B can include a single crystalline silicon carbon alloy material that is epitaxially aligned to a p-doped single crystalline silicon material within the p-type well 14.

Referring to FIG. 3, a dielectric masking layer 41 is deposited and patterned to cover the second silicon carbon alloy layer 40B. The dielectric masking layer 41 includes a dielectric material that is different from the dielectric material of the shallow trench isolation structure 22. For example, the shallow trench isolation structure 22 can include silicon oxide, and the dielectric masking layer 41 can include silicon nitride. The dielectric masking layer 41 can be deposited as a blanket layer, for example, by chemical vapor deposition (CVD). The patterning of the dielectric masking layer 41 can be effected by lithographic means, e.g., by applying a photoresist (not shown), lithographically patterning the photoresist such that the photoresist is present within the NFET region 102 and not present within the PFET region 101, and transferring the pattern in the patterned photoresist into the underlying dielectric material of the dielectric material layer 41. The thickness of the dielectric material layer 41 can be from 5 nm to 100 nm, although lesser and greater thicknesses can also be employed.

Referring to FIG. 4, a silicon germanium alloy layer 42 is deposited on the semiconductor surface of the first silicon carbon alloy layer 40A, while not being deposited on dielectric surfaces. The silicon germanium alloy material of the silicon germanium alloy layer 42 can be deposited by a selective deposition process, such as selective epitaxy, in which the silicon germanium alloy material nucleates, and is deposited, on semiconductor surfaces, while the silicon germanium alloy material does not nucleate, and is not deposited, on dielectric surfaces. Selective deposition of the silicon germanium alloy material can be effected, for example, by concurrently or alternatively flowing reactant gases that are precursors for the deposited silicon germanium alloy material and an etchant gas. Optionally, a carrier gas such as $H_2$, $N_2$, or Ar can be employed. The reactant gases include a silicon precursor gas such as $SiH_4$, $SiH_2Cl_2$, $SiHCl_3$, $SiCl_4$, $Si2H_6$, or combinations thereof, and a germanium precursor gas such as $GeH_4$, $Ge_2H_6$, or combinations thereof. The etchant gas can be, for example, HCl, which can be provided as a separate gas or generated from a chlorine-containing reactant gas as a byproduct.

In one embodiment, the thickness of the silicon germanium alloy layer 42 can be from 1 nm to 50 nm, as measured by the thickness of the deposited silicon germanium alloy material. The germanium concentration in the silicon germanium alloy layer 42 can be from 0.1% to 50%.

In one embodiment, the silicon germanium alloy layer 42 can include a single crystalline silicon germanium alloy material that is epitaxially aligned to the underlying single crystalline silicon carbon alloy material in the first silicon carbon alloy layer 40A.

In one embodiment, the atomic germanium concentration in the silicon germanium alloy layer 42 can be greater than 0.1%. In one embodiment, the atomic germanium concentration in the silicon germanium alloy layer 42 can be greater than 1.0%. In one embodiment, the atomic germanium concentration in the silicon germanium alloy layer 42 can be greater than 10%.

In one embodiment, the atomic germanium concentration in the silicon germanium alloy layer 42 can be less than 50%. In one embodiment, the atomic germanium concentration in the silicon germanium alloy layer 42 can be less than 25%. In one embodiment, the atomic germanium concentration in the silicon germanium alloy layer 42 can be less than 10%.

The combination of the first silicon carbon alloy layer 40A and the silicon germanium alloy layer 42 forms a layer stack, which is a stack of two horizontal material layers. The dielectric material layer 41 is subsequently removed selective to semiconductor materials and the dielectric material of the shallow trench isolation structure 22.

Referring to FIG. 5, a gate stack including a gate dielectric layer 50L and at least one gate electrode layer is formed on the layer stack (40A, 42) and the second silicon carbon alloy layer 40B. The gate dielectric layer 50L can include a dielectric material based on silicon oxide, e.g., silicon oxide, silicon oxynitride, or a stack of at least one silicon oxide and at least one silicon nitride. Alternately or additionally, the gate dielectric layer 50L can include a dielectric metal oxide having a dielectric constant greater than 8.0, which is known as high-k dielectric materials. Exemplary high-k dielectric materials that can be employed for the gate dielectric layer 50L include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y2O_xN_y$, a silicate thereof, and an alloy thereof. Each value of x is independently from 0.5 to 3 and each value of y is independently from 0 to 2. The gate dielectric layer 50L is formed directly on a surface of the layer stack (40A, 42) and directly on a surface of the second silicon carbon layer 40B. The composition and the thickness of the gate dielectric layer 50L in the PFET region 101 can be the same as the composition and the thickness of the gate dielectric layer 50L in the NFET region 102, respectively. The gate dielectric layer 50L can be formed, for example, by chemical vapor deposition (CVD), atomic layer deposition (ALD), or a combination thereof.

The at least one gate electrode layer can include at least one metallic material, at least one semiconductor material, or a stack of at least one metallic material and at least one semiconductor material. In one embodiment, the at least one gate electrode layer can include a vertical stack of a metallic gate electrode layer 52L including at least one metallic material and a semiconductor gate electrode layer 54L including at least one doped semiconductor material. The composition and the thickness of the metallic gate electrode layer 52L in the PFET region 101 can be the same as the composition and the thickness of the metallic gate electrode layer 52L in the NFET region 102, respectively. The composition and the thickness of the semiconductor gate electrode layer 54L in the PFET region 101 can be the same as the composition and the thickness of the semiconductor gate electrode layer 54L in the NFET region 102, respectively. The at least one gate electrode layer (52L, 54L) is deposited directly on the gate dielectric layer 50L. Each of the at least one gate electrode layer (52L, 54L) can be formed, for example, by chemical vapor deposition (CVD), atomic layer deposition (ALD), or a combination thereof.

Figure 6:
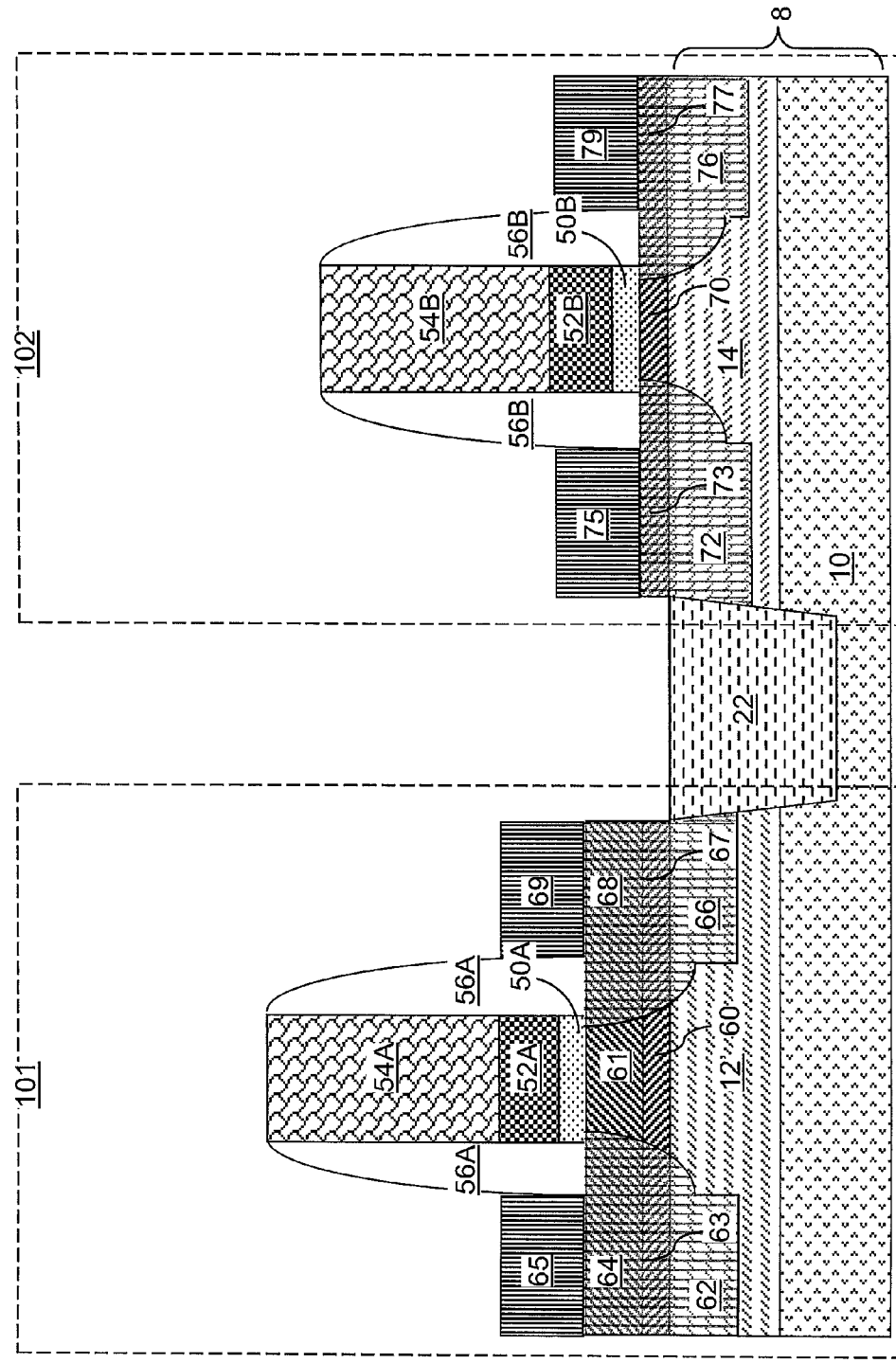
FIG. 6 is a vertical cross-sectional view of the first exemplary semiconductor structure after formation of gate electrodes, gate spacers, source regions, and drain regions according to the first embodiment of the present disclosure.

Referring to FIG. 6, gate electrodes and gate dielectrics are formed by patterning the gate stack (50L, 52L, 54L). A remaining portion of the gate dielectric layer 50L in the PFET region 101 is herein referred to as a first gate dielectric 50A, a remaining portion of the metallic gate electrode layer 52L in the PFET region 101 is herein referred to as a first metallic gate electrode 52A, and a remaining portion of the semiconductor gate electrode layer 54L in the PFET region 101 is herein referred to as a first semiconductor gate electrode 54A. The combination of the first metallic gate electrode 52A and the first semiconductor gate electrode 54A is herein referred to as a first gate electrode (52A, 54A). A remaining portion of the gate dielectric layer 50L in the NFET region 102 is herein referred to as a second gate dielectric 50B, a remaining portion of the metallic gate electrode layer 52L in the NFET region 102 is herein referred to as a second metallic gate electrode 52B, and a remaining portion of the semiconductor gate electrode layer 54L in the NFET region 102 is herein referred to as a second semiconductor gate electrode 54B. The combination of the second metallic gate electrode 52B and the second semiconductor gate electrode 54B is herein referred to as a second gate electrode (52B, 54B).

Gate spacers are formed, for example, by depositing a conformal dielectric material layer and anisotropically etching the conformal dielectric material layer. Remaining vertical portions of the conformal dielectric material layer around the first gate dielectric 50A and the first gate electrode (52A, 54A) is a first gate spacer 56A, and remaining vertical portions of the conformal dielectric material layer around the second gate dielectric 50B and the second gate electrode (52B, 54B) is a second gate spacer 56B.

Masked ion implantation can be performed before, and/or after, formation of the first and second gate spacers (56A, 56B) by performing masked ion implantations. Specifically, p-type dopants such as B, Ga, and/or In can be implanted into portions of the p-type well 12 and the layer stack (40A, 42;

See FIG. 5) to form a first source region and a first drain region, each having a p-type doping. The unimplanted portions of the p-type well 12 and the layer stack (40A, 42; See FIG. 5) constitute a first body region. N-type dopants such as P, As, and/or Sb can be implanted into portions of the n-type well 14 and the second silicon carbon alloy layer 40B (See FIG. 5) to form a second source region and a second drain region, each having an n-type doping. The unimplanted portions of the n-type well 14 and the second silicon carbon alloy layer 40B (See FIG. 5) constitute a second body region.

The first source region includes a vertical stack of a p-doped silicon source region 62, a p-doped silicon carbon alloy source region 63, and a p-doped silicon germanium alloy source region 64. Optionally, the first source region can include a first raised source region 65, which can be formed on the surface of the p-doped silicon germanium alloy source region 64 by selective epitaxy of a p-doped semiconductor material. The first drain region includes a vertical stack of a p-doped silicon drain region 66, a p-doped silicon carbon alloy drain region 67, and a p-doped silicon germanium alloy drain region 68. Optionally, the first drain region can include a first raised drain region 69, which can be formed on the surface of the p-doped silicon germanium alloy drain region 68 by selective epitaxy of a p-doped semiconductor material. The first body region includes a vertical stack of an n-doped silicon body region 12' (which is a remaining portion of the n-type well 12), an n-doped silicon carbon alloy body region 60, and an n-doped silicon germanium alloy body region 61. Thus, an NFET is provided within the NFET region 102.

The second source region includes a vertical stack of an n-doped silicon source region 72 and an n-doped silicon carbon alloy source region 73. Optionally, the second source region can include a second raised source region 75, which can be formed on the surface of the n-doped silicon carbon alloy source region 73 by selective epitaxy of an n-doped semiconductor material. The second drain region includes a vertical stack of an n-doped silicon drain region 76 and an n-doped silicon carbon alloy drain region 77. Optionally, the second drain region can include a second raised drain region 79, which can be formed on the surface of the n-doped silicon carbon alloy drain region 77 by selective epitaxy of an n-doped semiconductor material. The second body region includes a vertical stack of a p-doped silicon body region 14' (which is a remaining portion of the p-type well 14) and a p-doped silicon carbon alloy body region 70. Thus, a PFET is provided within the PFET region 101.

The first silicon carbon alloy layer includes the p-doped silicon carbon alloy source region 63, the p-doped silicon carbon alloy drain region 67, and the n-doped silicon carbon alloy body region 60. The silicon germanium alloy layer includes the p-doped silicon germanium alloy source region 64, the p-doped silicon carbon alloy drain region 67, and the n-doped silicon germanium alloy body region 61. The second silicon carbon alloy layer includes the n-doped silicon carbon alloy source region 73, the n-doped silicon carbon alloy drain region 77, and the p-doped silicon carbon alloy body region 70.

The silicon germanium alloy layer (64, 61, 68) is in contact with the first gate dielectric 50A, and the second silicon carbon alloy layer (73, 70, 77) is in contact with the second gate dielectric 50B. The first gate electrode 50A and the second gate electrode 50B have the same material composition and the same thickness. The first metallic gate electrode 52A and the second metallic gate electrode 52B have the same material composition and the same thickness. The first semiconductor gate electrode 54A and the second semiconductor gate electrode 54B have the same material composition and the same thickness.

Because selective deposition of the first and second silicon carbon alloy layers (63, 60, 67, 73, 70, 77) does not introduce carbon in the shallow trench isolation structure 22, the shallow trench isolation structure 22 can be substantially free of carbon. In other words, the shallow trench isolation structure 22A can be a silicon oxide material portion that is substantially free of carbon. The shallow trench isolation structure 22 can be in contact with at least one of the first source region (62, 63, 64, 65) and the first drain region (66, 67, 68, 69), and in contact with at least one of the second source region (72, 73, 75) and the second drain region (76, 77, 79).

Figure 7:
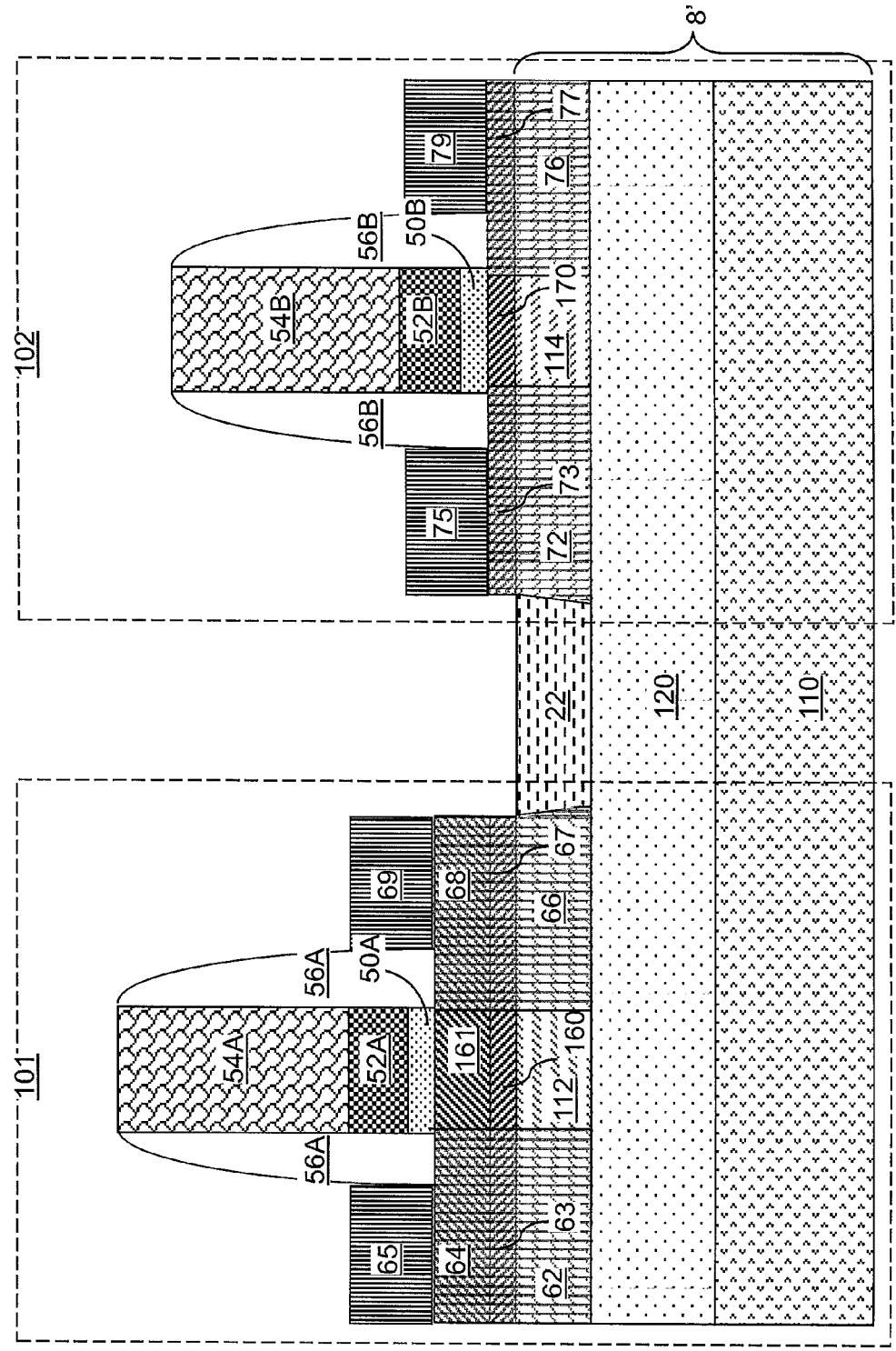
FIG. 7 is a vertical cross-sectional view of a second exemplary semiconductor structure according to a second embodiment of the present disclosure.

Referring to FIG. 7, a second exemplary semiconductor structure according to a second embodiment of the present disclosure can be derived from the first exemplary semiconductor structures illustrated in FIGS. 1-6 by substituting a semiconductor-on-insulator (SOI) substrate 8' for the substrate 8 in the first exemplary semiconductor structure. The SOI substrate as provided includes a handle substrate 110, a buried insulator layer 120, and a top silicon layer. The handle substrate 110 can include a semiconductor material, a conductive material, a dielectric material, or a combination thereof. The buried insulator layer 120 can be, for example, a layer of silicon oxide. The top silicon layer can be a single crystalline silicon layer. In one embodiment, the SOI substrate 8' can be an extremely thin semiconductor-on-insulator substrate in which the thickness of the top silicon layer is not greater than 5 nm.

In the second embodiment, the n-type well 12 in the first embodiment is replaced with a first silicon portion located within a top silicon layer and within the PFET region 101, and the p-type well 14 in the first embodiment is replaced with a second silicon portion located within the top silicon layer and within the NFET region 102. The first silicon portion within the PFET region 101 can be n-doped, or can include intrinsic silicon. The second silicon portion within the NFET region 102 can be p-doped, or can include intrinsic silicon.

The top silicon layer is subsequently changed into a layer including a shallow trench isolation structure 22, a p-doped silicon source region 62, a p-doped silicon drain region 66, and a first silicon body region 112, an n-doped silicon source region 72, an n-doped silicon drain region 76, and a second silicon body region 114. The first silicon body region 112 can be n-doped or intrinsic, and the second silicon body region 114 can be p-doped or intrinsic.

The first silicon carbon alloy layer includes the p-doped silicon carbon alloy source region 63, the p-doped silicon carbon alloy drain region 67, and a first silicon carbon alloy body region 160 that can be n-doped or intrinsic. The silicon germanium alloy layer includes the p-doped silicon germanium alloy source region 64, the p-doped silicon carbon alloy drain region 67, and a silicon germanium alloy body region 161 that can be n-doped or intrinsic. The second silicon carbon alloy layer includes the n-doped silicon carbon alloy source region 73, the n-doped silicon carbon alloy drain region 77, and a second silicon carbon alloy body region 170 that can be p-doped or intrinsic.

Because selective deposition of the first and second silicon carbon alloy layers (63, 160, 67, 73, 170, 77) does not introduce carbon in the shallow trench isolation structure 22, the shallow trench isolation structure 22 can be substantially free of carbon. Further, the buried insulator layer 120 can include silicon oxide that is substantially free of carbon. The shallow trench isolation structure 22 can be in contact with at least one of the first source region (62, 63, 64, 65) and the first drain region (66, 67, 68, 69), and in contact with at least one of the second source region (72, 73, 75) and the second drain region (76, 77, 79). The buried insulator layer 120 is in contact with the first source region (62, 63, 64, 65), the first drain region (66, 67, 68, 69), the second source region (72, 73, 75), and the second drain region (76, 77, 79).

Referring to FIG. 8, a third exemplary semiconductor structure according to a third embodiment of the present disclosure is derived from the first exemplary semiconductor structure of FIG. 1 by forming a dielectric masking layer 41 and a silicon germanium alloy layer 42 before forming silicon carbon alloy layers. Specifically, a dielectric masking layer 141 is deposited and patterned to cover the p-type well 14 in the NFET region 102. The dielectric masking layer 141 can have the same composition and thickness as the dielectric masking layer 41 in the first embodiment.

A silicon germanium alloy layer 42 is deposited on the semiconductor surface of the n-type well 12, while not being deposited on dielectric surfaces. The silicon germanium alloy material of the silicon germanium alloy layer 42 can be deposited by a selective deposition process, such as selective epitaxy, in which the silicon germanium alloy material nucleates, and is deposited, on semiconductor surfaces, while the silicon germanium alloy material does not nucleate, and is not deposited, on dielectric surfaces. The same deposition method can be employed to perform selective deposition of the silicon germanium alloy layer 42 in the third embodiment as in the first embodiment. The thickness, the composition, and the crystalline structure of the silicon germanium alloy layer 42 can be the same as in the first embodiment. In one embodiment, the silicon germanium alloy layer 42 can be a single crystalline silicon germanium alloy layer that is epitaxially aligned to the single crystalline silicon material in the n-type well 12. The dielectric masking layer 141 is subsequently removed selective to semiconductor materials and the shallow trench isolation structure.

Referring to FIG. 9, a first silicon carbon alloy layer 40A is formed directly on the silicon germanium alloy layer 42 and a second silicon carbon alloy layer 40B is formed directly on a top surface of the p-type well 14. The first silicon carbon alloy layer 40A and the second silicon carbon alloy layer 40B can be formed simultaneously employing the same processing steps as in the first embodiment. The thickness, the composition, and the crystalline structure of the first silicon carbon alloy layer 40A and the second silicon carbon alloy layer 40B can be the same as in the first embodiment. In one embodiment, the first silicon carbon alloy layer 40A can be epitaxially aligned to the single crystalline silicon germanium alloy in the silicon germanium alloy layer 42, and the second silicon carbon alloy layer 40B can be epitaxially aligned to the single crystalline silicon material in the p-type well 14.

Figure 10:
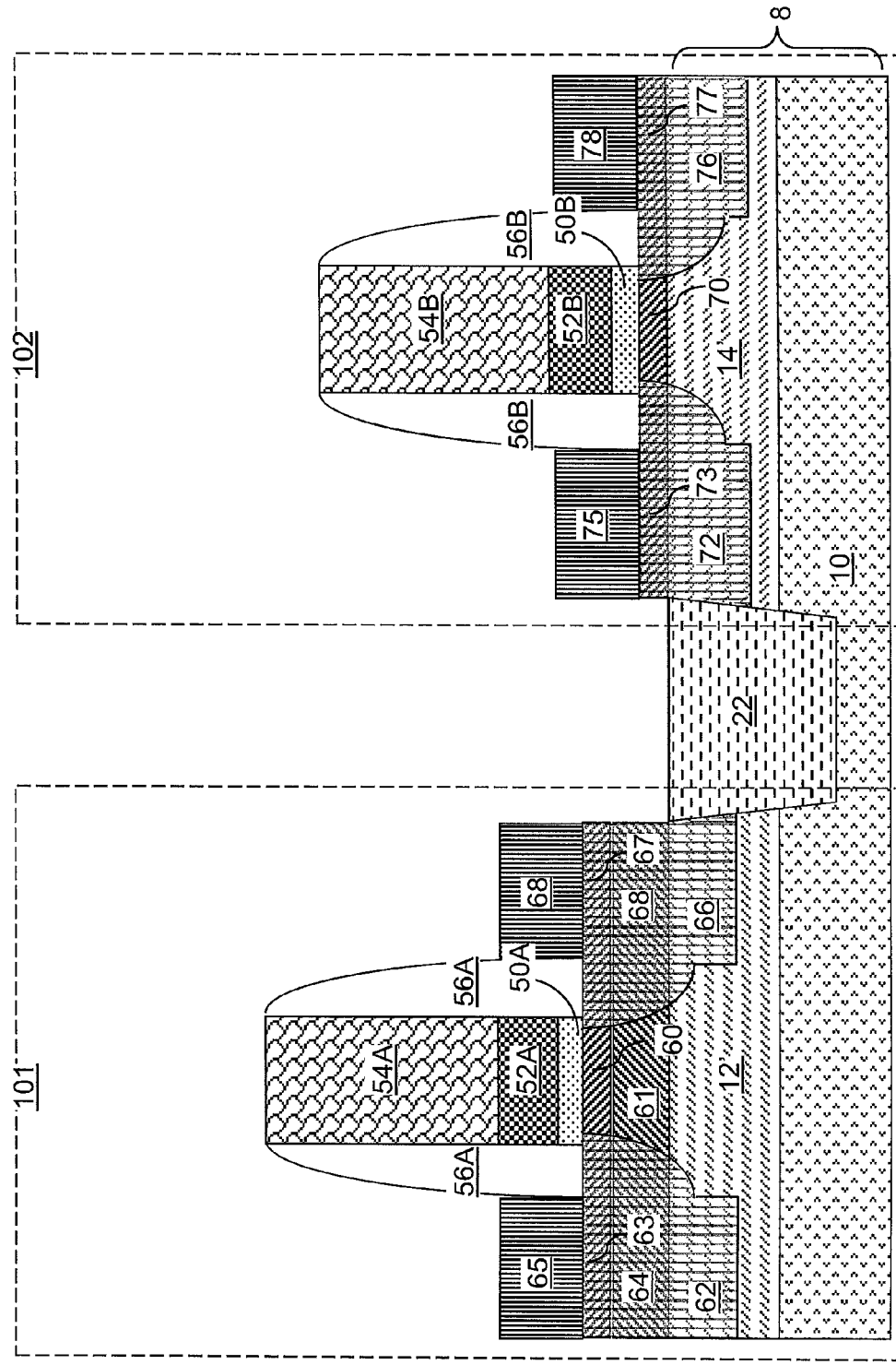
FIG. 10 is a vertical cross-sectional view of the third exemplary semiconductor structure after formation of gate electrodes, gate spacers, source regions, and drain regions according to the third embodiment of the present disclosure.

Referring to FIG. 10, processing steps of FIGS. 5 and 6 in the first embodiment are performed to form a first gate dielectric 50A, a second gate dielectric 50B, a first metallic gate electrode 52A, a second metallic gate electrode 52B, a first semiconductor gate electrode 54A, a second semiconductor gate electrode 54B, a first gate spacer 56A, a second gate spacer 56B, a first source region (62, 63, 64, 65), a second source region (72, 73, 75), a first drain region (66, 67, 68, 69), a second drain region (76, 77, 78), a first body region (12', 61, 60), and a second body region (14', 70).

In the third exemplary semiconductor structure, the first silicon carbon alloy layer (63, 60, 67) overlies the silicon germanium alloy layer (64, 61, 68) within the layer stack of the first silicon carbon alloy layer (63, 60, 67) overlies the silicon germanium alloy layer (64, 61, 68). Correspondingly, the first silicon carbon alloy layer (63, 60, 67) is in contact with the first gate dielectric 50A, and the second silicon carbon alloy layer (73, 70, 77) is in contact with the second gate dielectric 50B. The first gate electrode 50A and the second gate electrode 50B have the same material composition and the same thickness. The first metallic gate electrode 52A and the second metallic gate electrode 52B have the same material composition and the same thickness. The first semiconductor gate electrode 54A and the second semiconductor gate electrode 54B have the same material composition and the same thickness.

Figure 11:
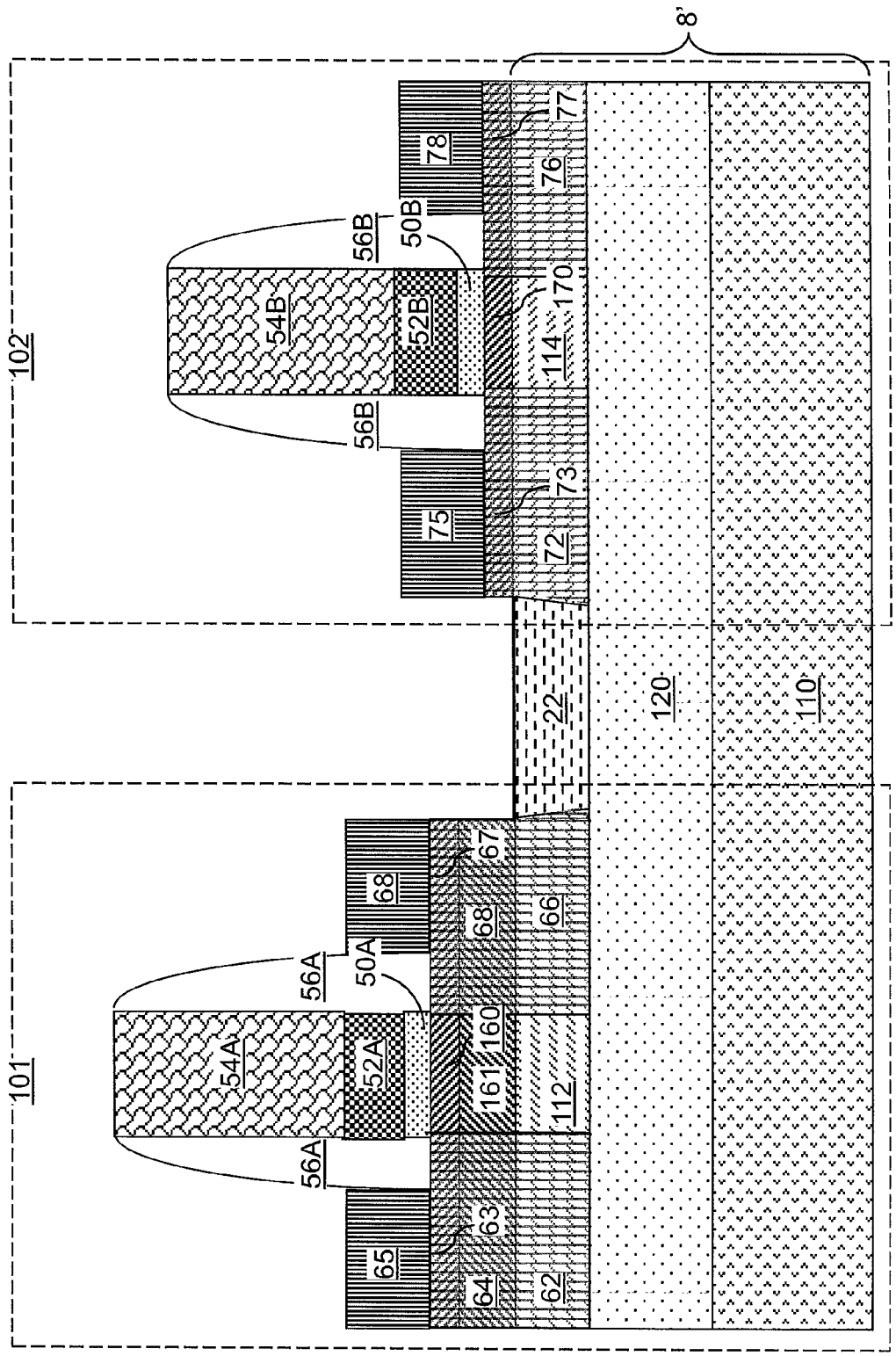
FIG. 11 is a vertical cross-sectional view of a fourth exemplary semiconductor structure according to a fourth embodiment of the present disclosure.

Referring to FIG. 11, a fourth exemplary semiconductor structure according to a fourth embodiment of the present disclosure can be derived from the third exemplary semiconductor structure by substituting a semiconductor-on-insulator (SOI) substrate 8' for the substrate 8 in the third exemplary semiconductor structure. The SOI substrate 8' as provided can be the same as in the second embodiment.

In the fourth embodiment, the n-type well 12 in the third embodiment is replaced with a first silicon portion located within a top silicon layer and within the PFET region 101, and the p-type well 14 in the third embodiment is replaced with a second silicon portion located within the top silicon layer and within the NFET region 102. The first silicon portion within the PFET region 101 can be n-doped, or can include intrinsic silicon. The second silicon portion within the NFET region 102 can be p-doped, or can include intrinsic silicon.

The top silicon layer is subsequently changed into a layer including a shallow trench isolation structure 22, a p-doped silicon source region 62, a p-doped silicon drain region 66, and a first silicon body region 112, an n-doped silicon source region 72, an n-doped silicon drain region 76, and a second silicon body region 114. The first silicon body region 112 can be n-doped or intrinsic, and the second silicon body region 114 can be p-doped or intrinsic.

The first silicon carbon alloy layer includes the p-doped silicon carbon alloy source region 63, the p-doped silicon carbon alloy drain region 67, and a first silicon carbon alloy body region 160 that can be n-doped or intrinsic. The silicon germanium alloy layer includes the p-doped silicon germanium alloy source region 64, the p-doped silicon carbon alloy drain region 67, and a silicon germanium alloy body region 161 that can be n-doped or intrinsic. The second silicon carbon alloy layer includes the n-doped silicon carbon alloy source region 73, the n-doped silicon carbon alloy drain region 77, and a second silicon carbon alloy body region 170 that can be p-doped or intrinsic.

The first silicon carbon alloy layer (63, 160, 67) overlies the silicon germanium alloy layer (64, 161, 68) within the layer stack of the first silicon carbon alloy layer (63, 160, 67) overlies the silicon germanium alloy layer (64, 161, 68). Correspondingly, the first silicon carbon alloy layer (63, 160, 67) is in contact with the first gate dielectric 50A, and the second silicon carbon alloy layer (73, 170, 77) is in contact with the second gate dielectric 50B.

Because selective deposition of the first and second silicon carbon alloy layers (63, 160, 67, 73, 170, 77) does not introduce carbon in the shallow trench isolation structure 22, the shallow trench isolation structure 22 can be substantially free of carbon. Further, the buried insulator layer 120 can include silicon oxide that is substantially free of carbon. The shallow trench isolation structure 22 can be in contact with at least one of the first source region (62, 63, 64, 65) and the first drain region (66, 67, 68, 69), and in contact with at least one of the second source region (72, 73, 75) and the second drain region (76, 77, 79). The buried insulator layer 120 is in contact with the first source region (62, 63, 64, 65), the first drain region (66, 67, 68, 69), the second source region (72, 73, 75), and the second drain region (76, 77, 79).

Figure 12:
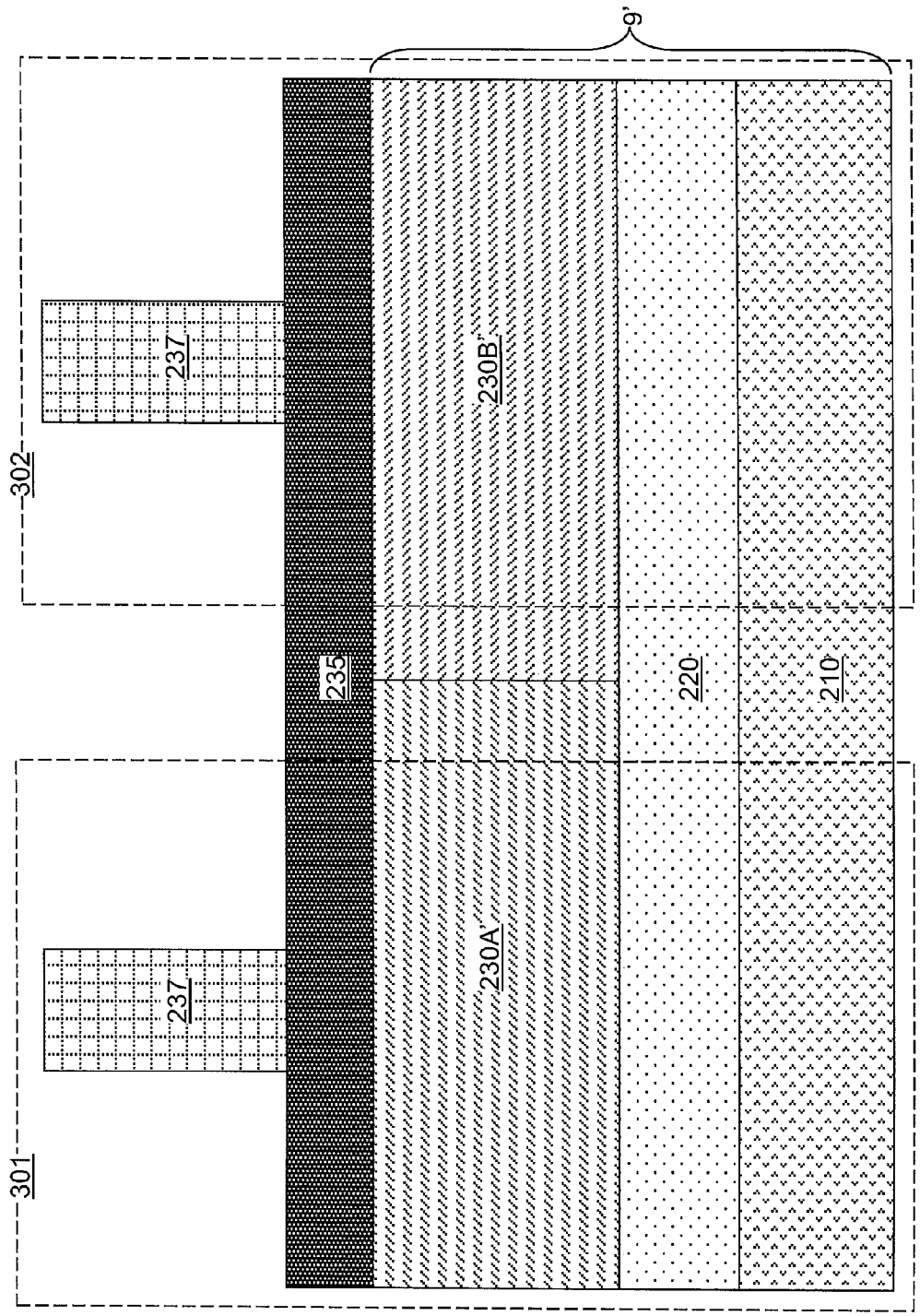
FIG. 12 is a vertical cross-sectional view of a fifth exemplary semiconductor structure after application and patterning of a photoresist over a fin cap dielectric layer according to a fifth embodiment of the present disclosure.

Referring to FIG. 12, a fifth exemplary semiconductor structure according to a fifth embodiment of the present disclosure includes a semiconductor-on-insulator (SOI) substrate 9', which includes a vertical stack of a handle substrate 210, a buried insulator layer 220, and a silicon layer including a n-doped silicon portion 230A' and a p-doped silicon portion 230B'. The n-doped silicon portion 230A' is located within a PFET region 301 and the p-doped silicon portion 230B' is located within an NFET region 302. The handle substrate 210 can be the same as the handle substrate 110 in the second and fourth embodiments. The buried insulator layer 220 can be the same as the buried insulator layer 120 in the second and fourth embodiment. The buried insulator layer 220 can include silicon oxide that is substantially free of carbon. The silicon layer can be a single crystalline silicon layer, and can have a thickness from 10 nm to 500 nm, although lesser and greater thicknesses can also be employed.

A fin cap dielectric layer 235 is deposited on the SOI substrate 9. The fin cap dielectric layer 235 includes a dielectric material such as silicon nitride, silicon oxide or a combination thereof. The fin cap dielectric layer 235 can be deposited, for example, by chemical vapor deposition (CVD). The thickness of the fin cap dielectric layer 235 can be from 10 nm to 200 nm, although lesser and greater thicknesses can also be employed.

A photoresist 237 is deposited over the fin cap dielectric layer 235 and lithographically patterned into shapes that correspond to horizontal cross-sectional areas of silicon fins to be subsequently formed. For example, the shapes of patterned portions of the photoresist 237 can include rectangles having lengthwise sides that are longer than widthwise sides.

Figure 13:
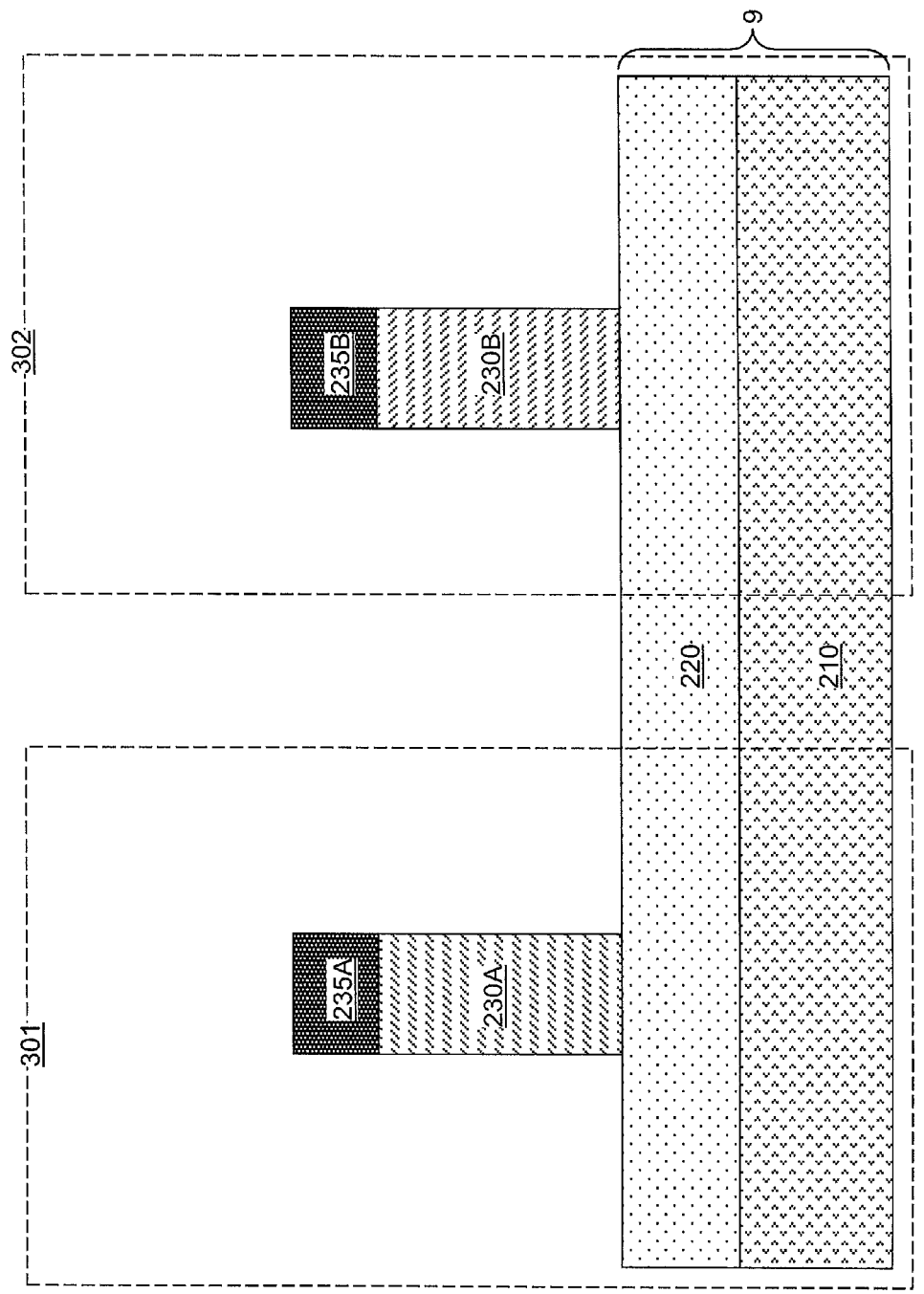
FIG. 13 is a vertical cross-sectional view of the fifth exemplary semiconductor structure after formation of semiconductor fin portions according to the fifth embodiment of the present disclosure.

Referring to FIG. 13, the pattern in the photoresist 237 is transferred into the fin cap dielectric layer 235 and the silicon layer by an anisotropic etch, which can stop on the surface of the buried insulator layer 220. A remaining portion of the n-doped silicon portion 230A' constitutes a first silicon fin 230A, which is herein referred to as a first silicon portion. A remaining portion of the p-doped silicon portion 230B' constitutes a second silicon fin 230B, which is herein referred to as a second silicon portion. A remaining portion of the fin cap dielectric layer 235 above the first silicon fin 230A is herein referred to as a first dielectric fin cap 235A. A remaining portion of the fin cap dielectric layer 235 above the second silicon fin 230B is herein referred to as a second dielectric fin cap 235B. The height of each silicon fin (230A, 230B) is the same as the initial thickness of the silicon layer. In one embodiment, the first silicon fin 230A and the second silicon fin 230B can include single crystalline silicon. The vertical cross-sectional view of FIG. 13 is along a widthwise direction of the first and second silicon fins (230A, 230B), i.e., in a direction perpendicular to the lengthwise direction of the first and second silicon fins (230A, 230B).

Figure 14:
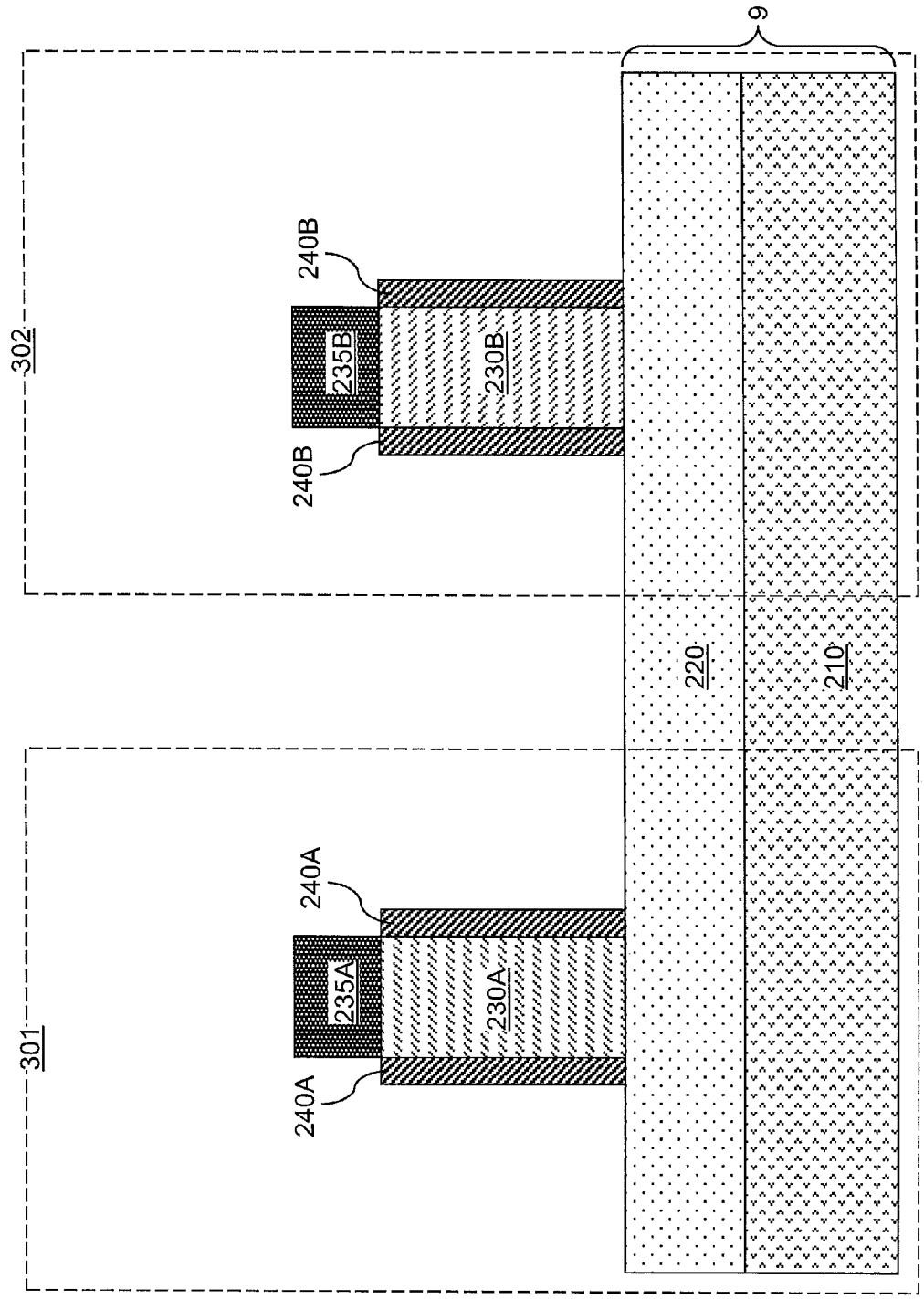
FIG. 14 is a vertical cross-sectional view of the fifth exemplary semiconductor structure after formation of first and second silicon carbon alloy layers according to the fifth embodiment of the present disclosure.

Referring to FIG. 14, a first silicon carbon alloy layer 240A and a second silicon carbon alloy layer 240B are deposited simultaneously on vertical sidewalls of the first silicon fin 230A and on vertical sidewalls of the second silicon fin 230B, respectively. The same deposition process can be employed to form the first and second silicon carbon alloy layers (240A, 240B) of the fifth embodiment as the deposition process employed to form the first and second silicon carbon alloy layers (40A, 40B) of the first embodiment. The first and second silicon carbon alloy layers (240A, 240B) of the fifth embodiment can have the same thickness, the same composition, and the same crystalline structure, as the first and second silicon carbon alloy layers (40A, 40B) of the first embodiment. The first silicon carbon alloy layer 340A and the second silicon carbon alloy layer 240B are formed as vertical layers, and are located on vertical sidewalls of semiconductor fin portions, i.e., the first silicon fin 230A and the second silicon fin 230B, that are located on a substrate 9, which include the handle substrate 210 and the buried insulator layer 220.

In one embodiment, the first silicon carbon alloy layer 240A can be epitaxially aligned to a single crystalline silicon material in the first silicon fin 230A, and the second silicon carbon alloy layer 240B can be epitaxially aligned to a single crystalline silicon material in the second silicon fin 230B.

Figure 15:
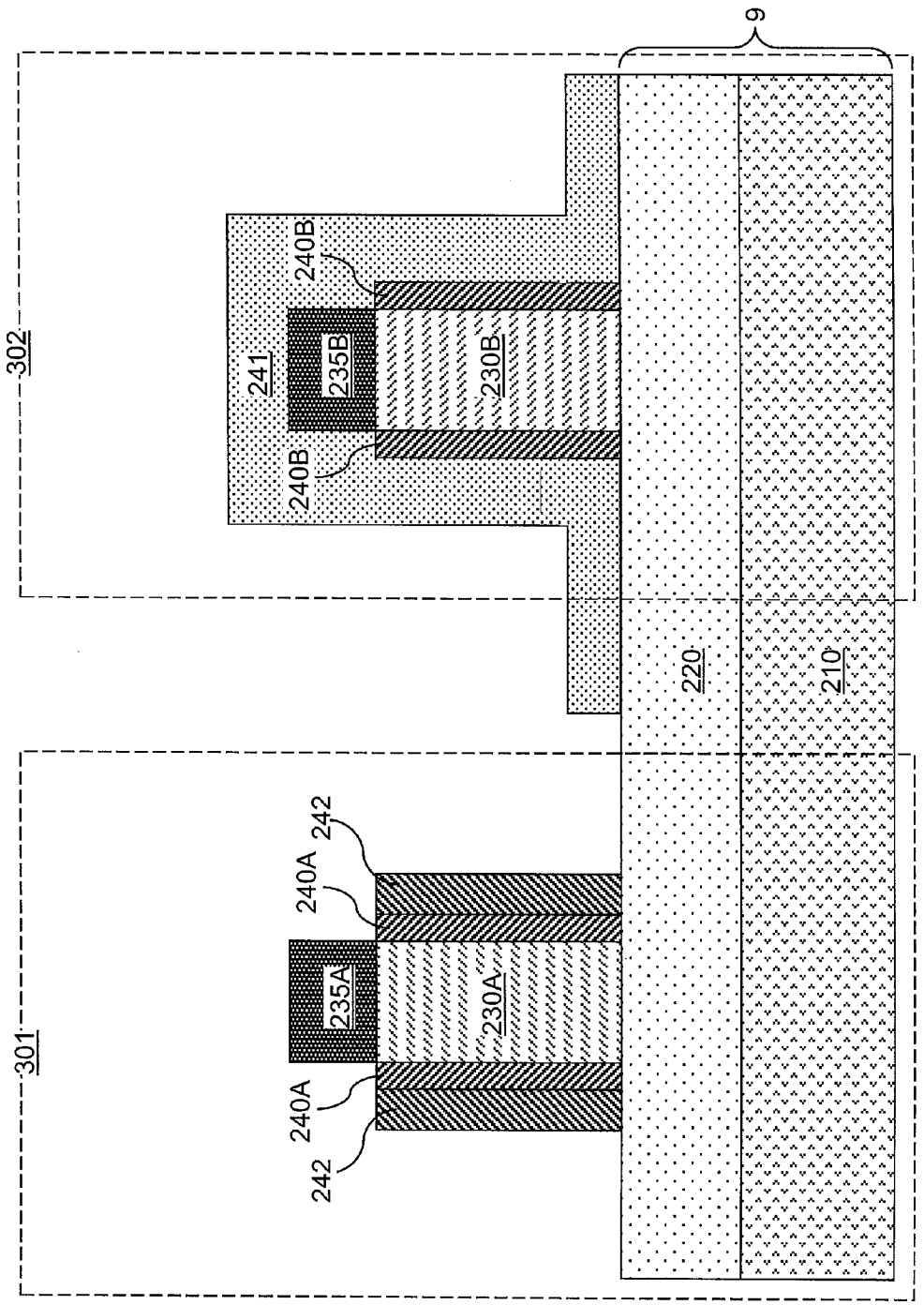
FIG. 15 is a vertical cross-sectional view of the fifth exemplary semiconductor structure after formation and patterning of a dielectric masking layer and formation of a silicon germanium alloy layer according to the fifth embodiment of the present disclosure.

Referring to FIG. 15, a dielectric masking layer 241 is deposited and patterned to cover the second silicon carbon alloy layer 40B, the second silicon fin 230B, and the second dielectric fin cap 235B. The dielectric masking layer 241 can be formed by the same processing steps employed to form the dielectric masking layer 41 in the first embodiment. The thickness and the composition of the dielectric masking layer 241 of the fifth embodiment can be the same as the thickness and the composition of the dielectric masking layer 41 of the first embodiment.

A silicon germanium alloy layer 242 is deposited on the semiconductor surface of the first silicon carbon alloy layer 240A, while not being deposited on dielectric surfaces. The silicon germanium alloy material of the silicon germanium alloy layer 242 can be deposited by a selective deposition process, such as selective epitaxy, in which the silicon germanium alloy material nucleates, and is deposited, on semiconductor surfaces, while the silicon germanium alloy material does not nucleate, and is not deposited, on dielectric surfaces. The silicon germanium alloy layer 242 of the fifth embodiment can be formed by the same processing steps employed to form the silicon germanium alloy layer 42 in the first embodiment. The thickness, composition, and the crystalline structure of the silicon germanium alloy layer 242 of the fifth embodiment can be the same as the thickness, composition, and the crystalline structure of the silicon germanium layer 42 of the first embodiment, respectively.

Figure 16:
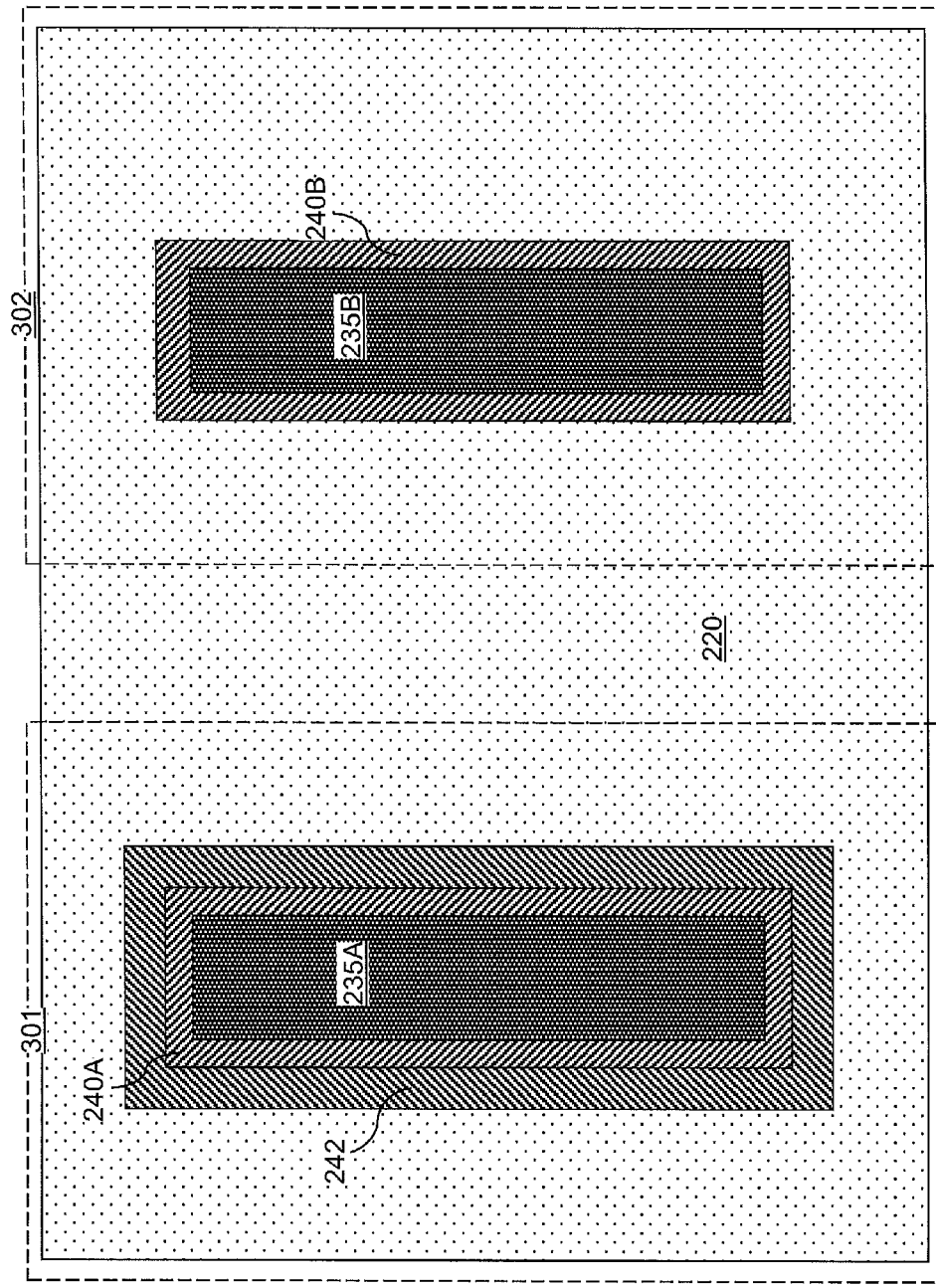
FIG. 16 is a top down view of the fifth exemplary semiconductor structure after removal of the dielectric masking layer according to the fifth embodiment of the present disclosure.

Referring to FIG. 16, the dielectric masking layer 241 is removed selective to semiconductor materials and the dielectric materials of the buried insulator layer 220 and the first and second dielectric fin caps (235A, 235B).

Figure 17:
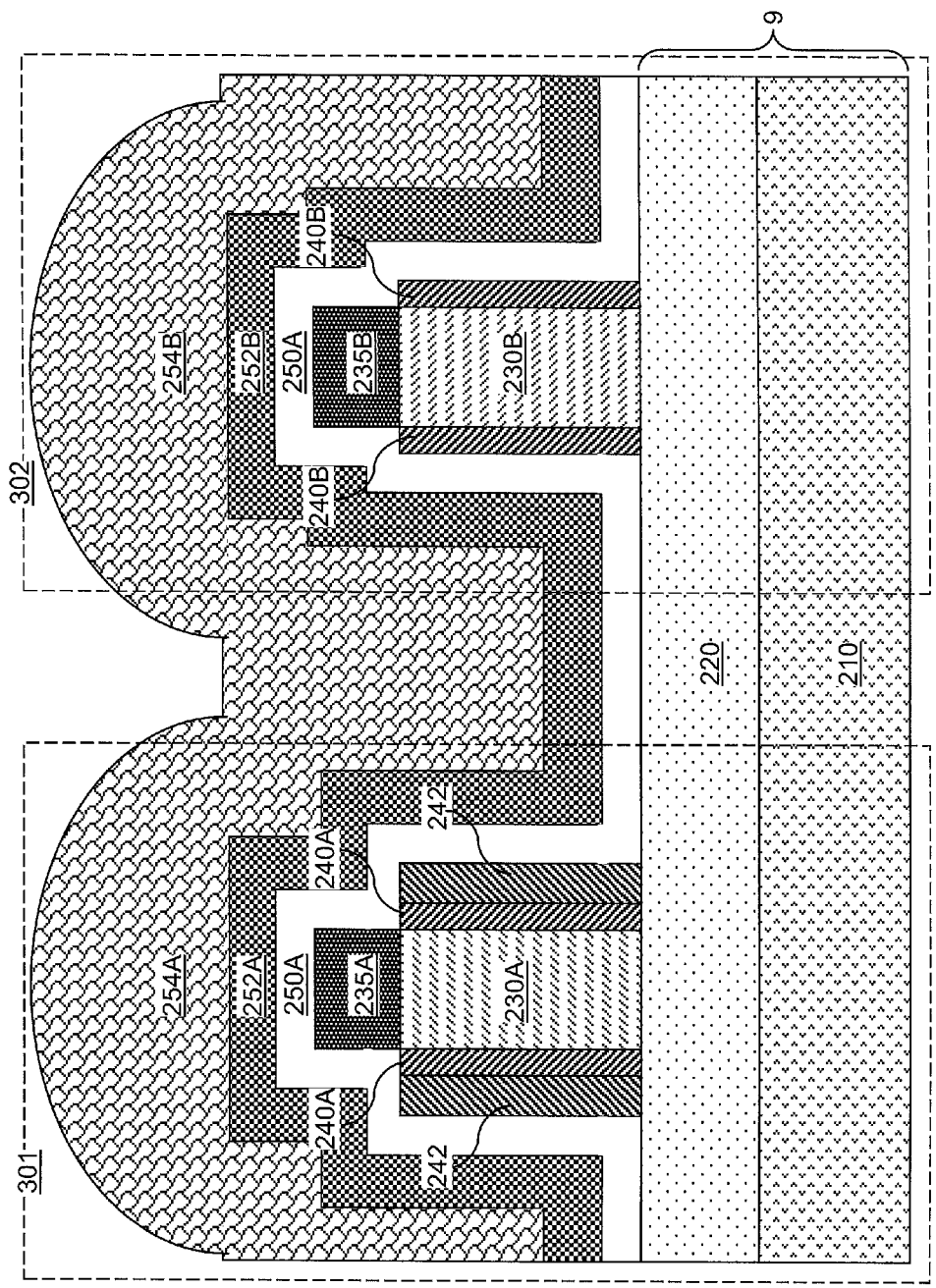
FIG. 17 is a vertical cross-sectional view of the fifth exemplary semiconductor structure after formation and patterning of a gate dielectric layer and a gate electrode layer according to the fifth embodiment of the present disclosure.
Figure 18:
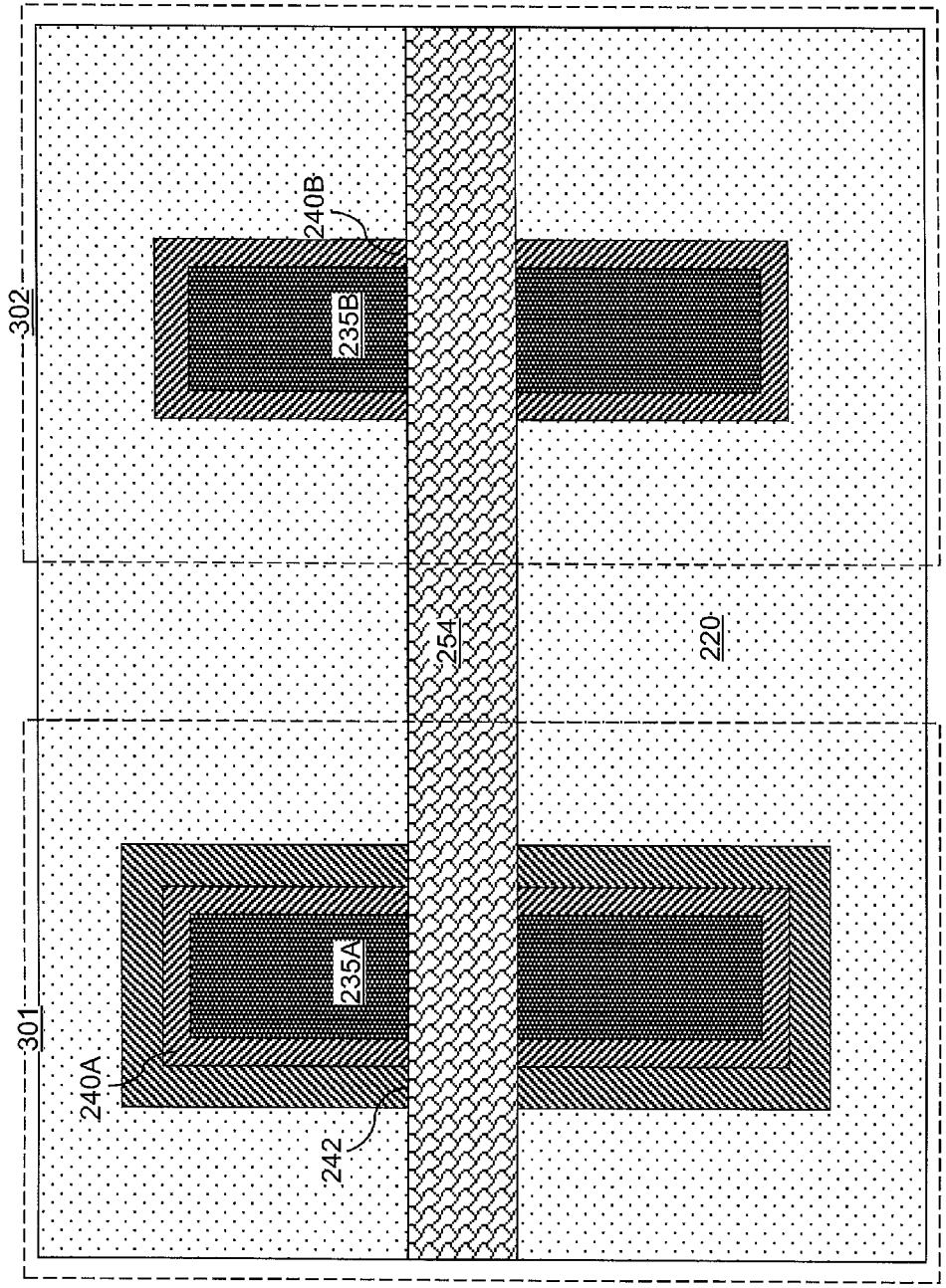
FIG. 18 is a top down view of the fifth exemplary semiconductor structure of FIG. 17 according to the fifth embodiment of the present disclosure.

Referring to FIGS. 17 and 18, a gate stack including a gate dielectric layer and at least one gate electrode layer is formed on the layer stack (240A, 242) and the second silicon carbon alloy layer 240B. The gate dielectric layer is formed directly on the outer surfaces of the layer stack of the first silicon carbon alloy layer 240A and the silicon germanium alloy layer 242, and directly on the outer surfaces of the second silicon carbon layer 240B. The gate dielectric layer of the fifth embodiment can be deposited employing the same methods as the gate dielectric layer 50L of the first embodiment. The thickness and the composition of the gate dielectric layer of the fifth embodiment can be the same as the thickness and the composition of the gate dielectric layer 50L of the first embodiment.

The at least one gate electrode layer can include at least one metallic material, at least one semiconductor material, or a stack of at least one metallic material and at least one semiconductor material. In one embodiment, the at least one gate electrode layer can include a vertical stack of a metallic gate electrode layer including at least one metallic material and a semiconductor gate electrode layer including at least one doped semiconductor material. The composition and the thickness of the metallic gate electrode layer of the fifth embodiment can be the same as the composition and the thickness of the metallic gate electrode layer 52L of the first embodiment, respectively. The composition and the thickness of the semiconductor gate electrode layer of the fifth embodiment can be the same as the composition and the thickness of the gate electrode layer 54L, respectively.

Gate electrodes and gate dielectrics are formed by patterning the gate stack including the semiconductor gate electrode layer, the metallic gate electrode layer, and the gate dielectric layer. A remaining portion of the gate dielectric layer in the PFET region 301 is herein referred to as a first gate dielectric 250A, a remaining portion of the metallic gate electrode layer in the PFET region 301 is herein referred to as a first metallic gate electrode 252A, and a remaining portion of the semiconductor gate electrode layer in the PFET region 301 is herein referred to as a first semiconductor gate electrode 254A. The combination of the first metallic gate electrode 252A and the first semiconductor gate electrode 254A is herein referred to as a first gate electrode (252A, 254A). A remaining portion of the gate dielectric layer in the NFET region 302 is herein referred to as a second gate dielectric 250B, a remaining portion of the metallic gate electrode layer in the NFET region 302 is herein referred to as a second metallic gate electrode 252B, and a remaining portion of the semiconductor gate electrode layer in the NFET region 302 is herein referred to as a second semiconductor gate electrode 254B. The combination of the second metallic gate electrode 252B and the second semiconductor gate electrode 254B is herein referred to as a second gate electrode (252B, 254B).

Figure 19:
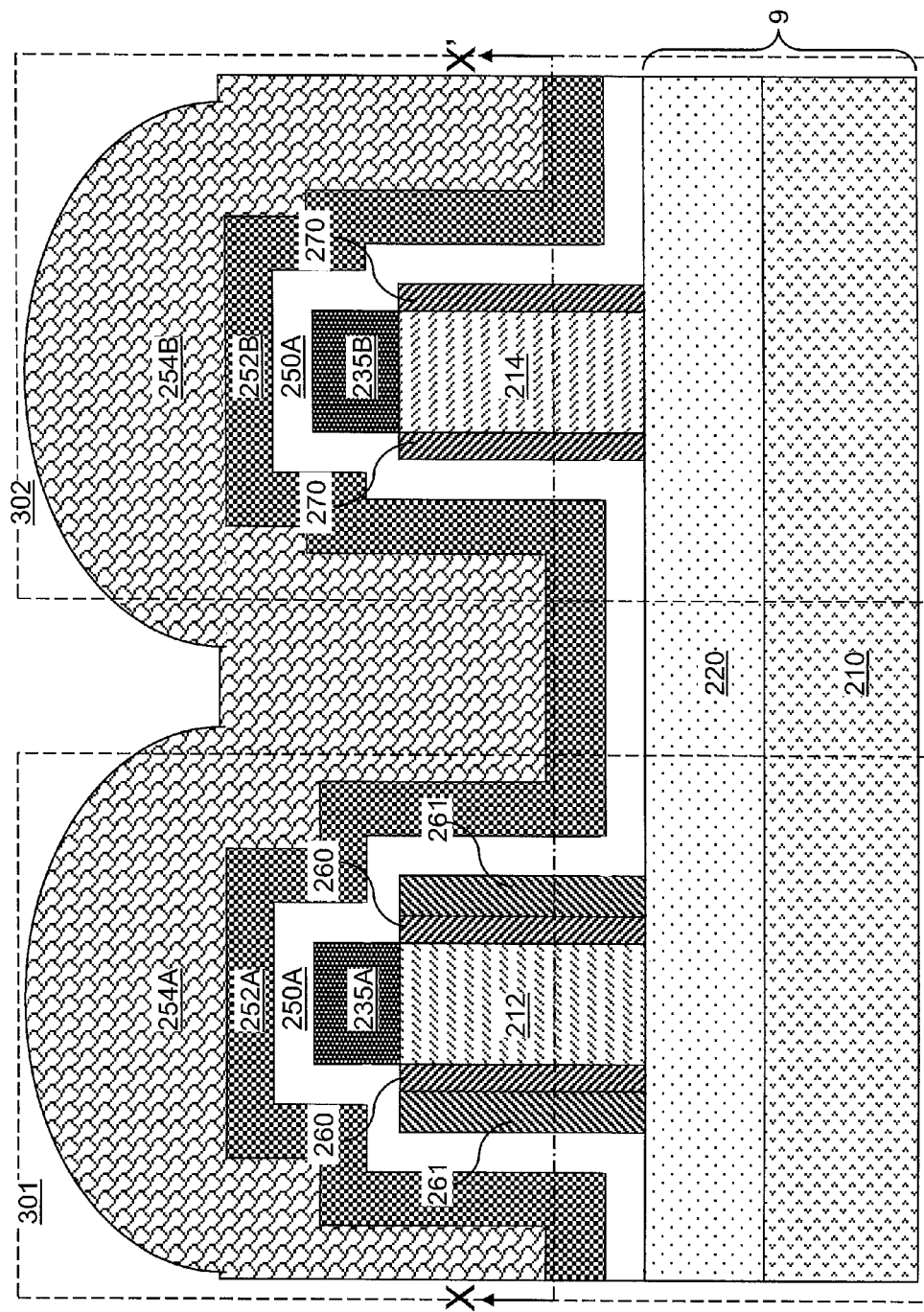
FIG. 19 is a vertical cross-sectional view of the fifth exemplary semiconductor structure after formation of source regions and drain regions according to the fifth embodiment of the present disclosure.
Figure 20:
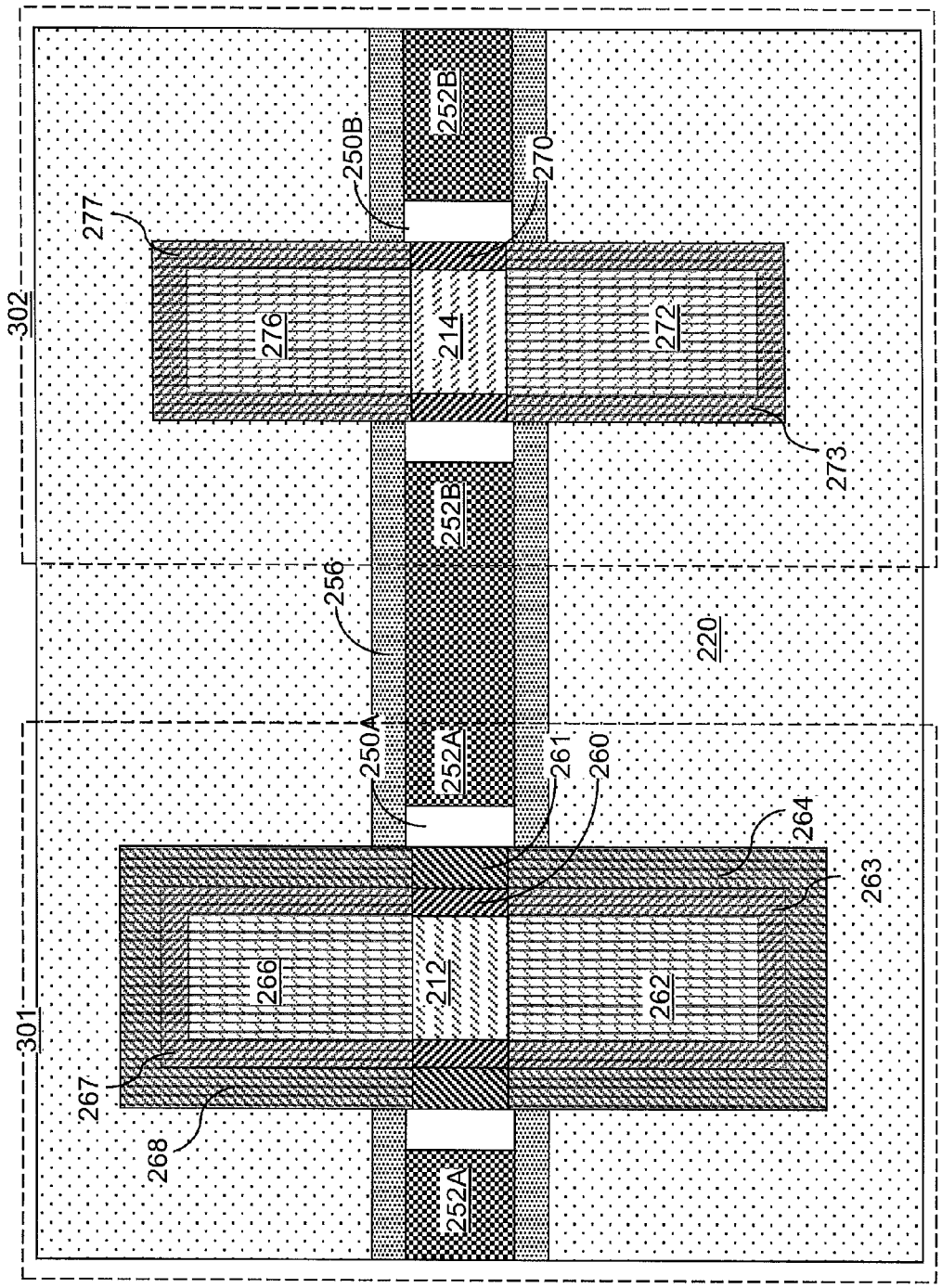
FIG. 20 is a horizontal cross-sectional view of the fifth exemplary semiconductor structure of FIG. 19 along the plane X-X' in FIG. 19 according to the fifth embodiment of the present disclosure.

Referring to FIGS. 19 and 20, gate spacers 256 can be formed, for example, by depositing a conformal dielectric material layer and anisotropically etching the conformal dielectric material layer. Masked ion implantation can be performed before, and/or after, formation of the gate spacers 256 by performing masked ion implantations. Specifically, p-type dopants such as B, Ga, and/or In can be implanted into portions of the first silicon fin 230A (See FIG. 17) and the layer stack (240A, 242; See FIG. 17) to form a first source region and a first drain region, each having a p-type doping. The unimplanted portions of the first silicon fin 230A and the layer stack (240A, 242; See FIG. 17) constitute a first body region. N-type dopants such as P, As, and/or Sb can be implanted into portions of the second silicon fin 230B and the second silicon carbon alloy layer 240B (See FIGS. 17 and 18) to form a second source region and a second drain region, each having an n-type doping. The unimplanted portions of the second silicon fin 230B and the second silicon carbon alloy layer 240B (See FIG. 17) constitute a second body region.

The first source region includes a lateral stack of a p-doped silicon source region 262, a p-doped silicon carbon alloy source region 263, and a p-doped silicon germanium alloy source region 264. The first drain region includes a lateral stack of a p-doped silicon drain region 266, a p-doped silicon carbon alloy drain region 267, and a p-doped silicon germanium alloy drain region 268. The first body region includes a lateral stack of an n-doped silicon body region 212 (which is a remaining unimplanted portion of the first silicon fin 230A), an n-doped silicon carbon alloy body region 260, and an n-doped silicon germanium alloy body region 261. Thus, a PFET is provided within the PFET region 301.

The second source region includes a lateral stack of an n-doped silicon source region 272 and an n-doped silicon carbon alloy source region 273. The second drain region includes a lateral stack of an n-doped silicon drain region 276 and an n-doped silicon carbon alloy drain region 277. The second body region includes a lateral stack of a p-doped silicon body region 214 (which is a remaining unimplanted portion of the second silicon fin 230B) and a p-doped silicon carbon alloy body region 270. Thus, an NFET is provided within the NFET region 302.

The first silicon carbon alloy layer includes the p-doped silicon carbon alloy source region 263, the p-doped silicon carbon alloy drain region 267, and the n-doped silicon carbon alloy body region 260. The silicon germanium alloy layer includes the p-doped silicon germanium alloy source region 264, the p-doped silicon carbon alloy drain region 267, and the n-doped silicon germanium alloy body region 261. The second silicon carbon alloy layer includes the n-doped silicon carbon alloy source region 273, the n-doped silicon carbon alloy drain region 277, and the p-doped silicon carbon alloy body region 270.

The silicon germanium alloy layer (264, 261, 268) is in contact with the first gate dielectric 250A, and the second silicon carbon alloy layer (273, 270, 277) is in contact with the second gate dielectric 250B. The first gate electrode 250A and the second gate electrode 250B have the same material composition and the same thickness. The first metallic gate electrode 252A and the second metallic gate electrode 252B have the same material composition and the same thickness. The first semiconductor gate electrode 254A and the second semiconductor gate electrode 254B have the same material composition and the same thickness.

Because selective deposition of the first and second silicon carbon alloy layers (263, 260, 267, 273, 270, 277) does not introduce carbon into the buried insulator layer 220, the buried insulator layer 220 can be substantially free of carbon. In one embodiment, the buried insulator layer 220 can be a silicon oxide material portion that is substantially free of carbon. The buried insulator layer 220 is in contact with the first source region (262, 263, 264) and the first drain region (266, 267, 268), and in contact with at least one of the second source region (272, 273) and the second drain region (276, 277).

Figure 21:
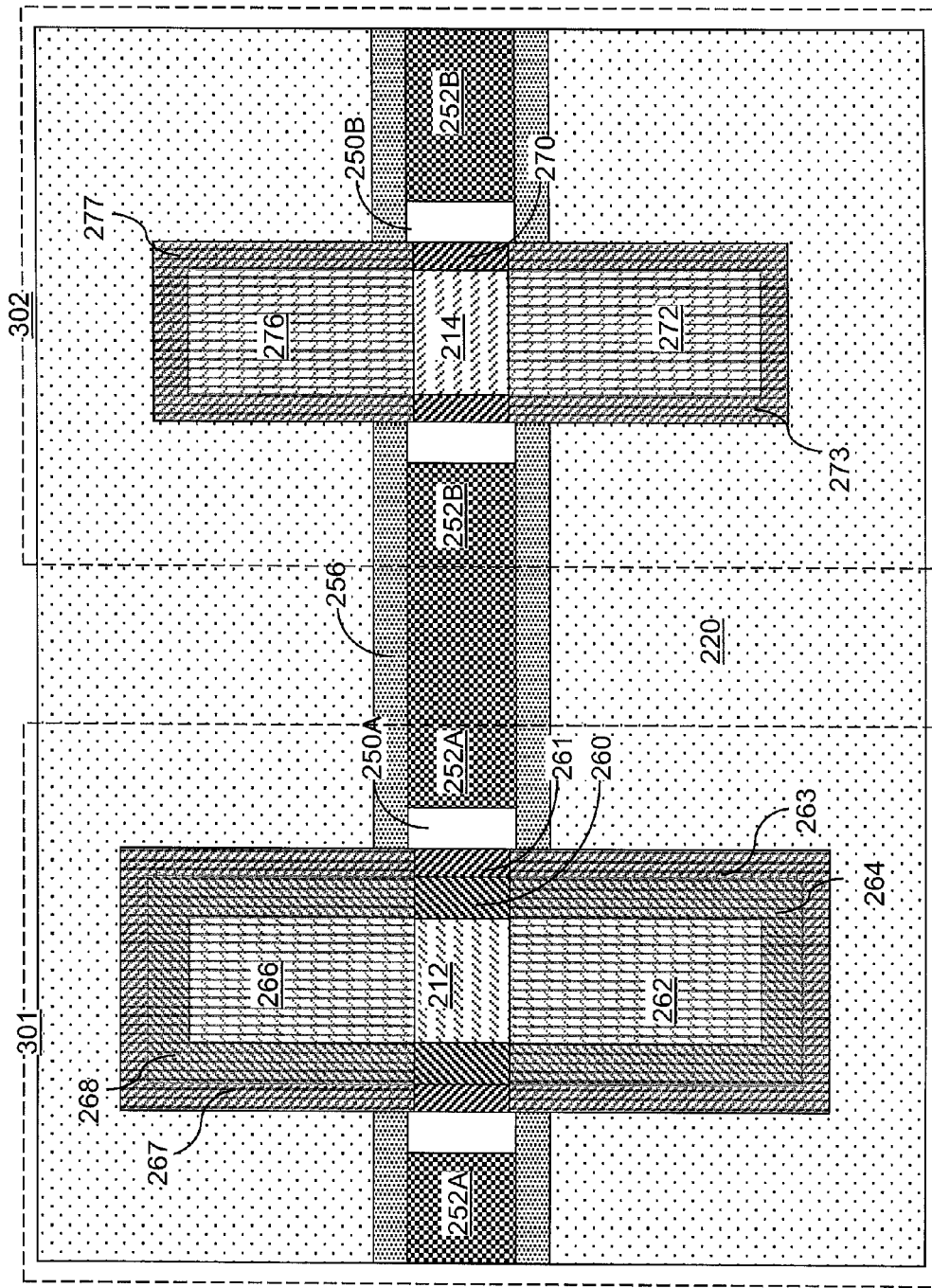
FIG. 21 is a horizontal cross-sectional view of a sixth exemplary semiconductor structure according to a sixth embodiment of the present disclosure.

Referring to FIG. 21, a sixth exemplary semiconductor structure according to a sixth embodiment of the present disclosure can be derived from the fifth exemplary semiconductor structure of FIG. 13 by forming a dielectric masking layer 241 (See FIG. 15) and a silicon germanium alloy layer 242 (See FIG. 15) before forming silicon carbon alloy layers (240A, 240B; See FIG. 14).

The silicon germanium alloy layer 242 is deposited on the semiconductor surface of the first silicon fin 230A, while not being deposited on dielectric surfaces. The silicon germanium alloy material of the silicon germanium alloy layer 242 can be deposited by a selective deposition process, such as selective epitaxy, in which the silicon germanium alloy material nucleates, and is deposited, on semiconductor surfaces, while the silicon germanium alloy material does not nucleate, and is not deposited, on dielectric surfaces. The same deposition method can be employed to perform selective deposition of the silicon germanium alloy layer 242 in the sixth embodiment as in the fifth embodiment. The thickness, the composition, and the crystalline structure of the silicon germanium alloy layer 242 can be the same as in the fifth embodiment. In one embodiment, the silicon germanium alloy layer 242 can be a single crystalline silicon germanium alloy layer that is epitaxially aligned to the single crystalline silicon material in the first silicon fin 230A (See FIG. 13). The dielectric masking layer 241 is subsequently removed selective to semiconductor materials and the shallow trench isolation structure.

Subsequently, a first silicon carbon alloy layer 40A is formed directly on the silicon germanium alloy layer 242 and a second silicon carbon alloy layer 240B is formed directly on sidewall surfaces of the second silicon fin 230B (See FIG. 13). The first silicon carbon alloy layer 240A and the second silicon carbon alloy layer 240B can be formed simultaneously employing the same processing steps as in the fifth embodiment. The thickness, the composition, and the crystalline structure of the first silicon carbon alloy layer 240A and the second silicon carbon alloy layer 240B can be the same as in the fifth embodiment. In one embodiment, the first silicon carbon alloy layer 240A can be epitaxially aligned to the single crystalline silicon germanium alloy in the silicon germanium alloy layer 242, and the second silicon carbon alloy layer 240B can be epitaxially aligned to the single crystalline silicon material in the second silicon fin 230B (See FIG. 13).

Processing steps of FIGS. 16-20 in the sixth embodiment are performed to form a first gate dielectric 250A, a second gate dielectric 250B, a first metallic gate electrode 252A, a second metallic gate electrode 252B, a first semiconductor gate electrode 254A, a second semiconductor gate electrode 254B, gate spacers 256, a first source region (262, 263, 264), a second source region (272, 273), a first drain region (266, 267, 268), a second drain region (276, 277), a first body region (212, 261, 260), and a second body region (214, 270).

In the sixth exemplary semiconductor structure, the first silicon carbon alloy layer (263, 260, 267) is located directly on outer sidewalls of the silicon germanium alloy layer (264, 261, 268) within the layer stack of the first silicon carbon alloy layer (263, 260, 267) overlies the silicon germanium alloy layer (264, 261, 268). Correspondingly, the first silicon carbon alloy layer (263, 260, 267) is in contact with the first gate dielectric 250A, and the second silicon carbon alloy layer (273, 270, 277) is in contact with the second gate dielectric 250B. The first gate electrode 250A and the second gate electrode 250B have the same material composition and the same thickness. The first metallic gate electrode 252A and the second metallic gate electrode 252B have the same material composition and the same thickness. The first semiconductor gate electrode 254A and the second semiconductor gate electrode 254B have the same material composition and the same thickness.

In the various embodiment of the present disclosure, the silicon carbon alloy layer can be a thin single crystalline layer having a width less than 2.0 nm. The silicon carbon alloy layer has a delta doping profile, and a portion of the silicon carbon alloy layer is employed as a channel of a PFET. The structures of the present disclosure provides the advantage of a greater total amount of carbon and a higher carbon concentration that is available through ion implantation (which is limited to less than 1.0% in atomic concentration in order to preserve crystallinity of a silicon carbon alloy in a bulk structure). Further, the structures of the present disclosure are not susceptible to overetching of shallow trench isolation structures by preventing incorporation of carbon into shallow trench isolation structures. Yet further voltage is independent of widths of the field effect transistors. Still further, workfunction shift can be significant by employing the silicon carbon alloy layers alone, and NFETs can use same gate metal as PFETs. In other words, use of additional lanthanum on a PFET electrode can be avoided.

While the disclosure has been described in terms of specific embodiments, it is evident in view of the foregoing description that numerous alternatives, modifications and variations will be apparent to those skilled in the art. Various embodiments of the present disclosure can be employed either alone or in combination with any other embodiment, unless expressly stated otherwise or otherwise clearly incompatible among one another. Accordingly, the disclosure is intended to encompass all such alternatives, modifications and variations which fall within the scope and spirit of the disclosure and the following claims.

What is claimed is:

1. A method of forming a semiconductor structure comprising a p-type field effect transistor (PFET) and an n-type field effect transistor (NFET), said method comprising:
    forming a layer stack on a first silicon portion of a substrate comprising a first silicon carbon alloy layer formed directly on a topmost surface of a first silicon portion of a substrate and a silicon germanium alloy layer formed directly on a topmost surface of said first silicon carbon alloy layer;
    forming a second silicon carbon alloy layer directly on a topmost surface of a second silicon portion of said substrate;
    forming a gate stack of a gate dielectric layer and a gate electrode layer directly on a topmost surface of a portion of said layer stack and on a topmost surface of a portion of said second silicon carbon alloy layer;
    patterning said gate stack to form a first gate dielectric and a first gate electrode of a p-type field effect transistor (PFET) and a second gate dielectric and a second gate electrode of an n-type field effect transistor (NFET);
    forming a first source region and a first drain region of said PFET by implanting p-type dopants into portions of said layer stack and said first silicon portion; and
    forming a second source region and a second drain region of said NFET by implanting n-type dopants into portions of said second silicon carbon layer and said second silicon portion.

2. The method of claim 1, wherein said gate dielectric layer is formed directly on a surface of said layer stack and directly on a surface of said second silicon carbon layer.

3. The method of claim 2, wherein said gate electrode layer is deposited directly on said gate dielectric layer.

4. The method of claim 3, wherein said first gate dielectric and said second gate dielectric have a same composition and a same thickness.

5. The method of claim 4, wherein said same thickness is not greater than 2.0 nm.

6. The method of claim 1, wherein said second silicon carbon alloy layer is formed simultaneously with formation of said first silicon carbon alloy layer in a same deposition process.

7. The method of claim 6, wherein said first silicon carbon alloy layer and said second silicon carbon alloy layer have a same thickness and a same carbon concentration profile.

8. The method of claim 7, wherein said same thickness is not greater than 2.0 nm, and said same carbon concentration profile has an atomic carbon concentration between 0.1% and 50% at a peak concentration.

9. The method of claim 1, wherein a silicon oxide material portion is provided or formed within said substrate, wherein said silicon oxide material portion is in contact with at least one of said first source region and said first drain region upon formation of said first source region and said first drain region, and is in contact with at least one of said second source region and said second drain region upon formation of said second source region and said second drain region.

10. The method of claim 9, wherein said silicon oxide material portion is substantially free of carbon after formation of said first source region, said first drain region, said second source region, and said second drain region.

11. The method of claim 1, wherein said first silicon carbon alloy layer and said second silicon carbon alloy layer are formed as horizontal layers on a bulk semiconductor substrate.

12. The method of claim 1, wherein said first silicon carbon alloy layer and said second silicon carbon alloy layer are formed as horizontal layers on a top semiconductor layer of a semiconductor-on-insulator (SOI) substrate.

13. The method of claim 1, wherein said first silicon carbon alloy layer and said second silicon carbon alloy layer are formed as vertical layers on sidewalls of semiconductor fin portions located on said substrate.

14. The method of claim 13, further comprising forming a dielectric fin cap on each of said semiconductor fin portions prior to forming said first silicon carbon alloy layer and said second silicon carbon alloy layer, wherein said firs silicon carbon alloy layer and said second silicon carbon alloy layer are formed by selective epitaxy and do not grow from said dielectric fin caps.

15. The method of claim 1, wherein said first silicon carbon alloy layer and said second silicon carbon alloy layer are formed as single crystalline material layers having an epitaxial alignment with an underlying silicon-containing single crystalline semiconductor material.

16. The method of claim 1, wherein said gate dielectric layer is formed directly on a surface of said first silicon carbon alloy layer.

17. The method of claim 1, wherein said gate dielectric layer is formed directly on said silicon germanium alloy layer.

18. The method of claim 1, wherein said first gate electrode and said second gate electrode have a same material composition and a same thickness.

19. The method of claim 1, wherein said first silicon carbon alloy layer and said second silicon carbon alloy layer are formed simultaneously.

20. The method of claim 18, further comprising:
   forming a dielectric masking layer over said second silicon carbon alloy layer, wherein a top surface of said first silicon carbon alloy layer is physically exposed; and
   depositing said silicon germanium alloy layer on said first silicon carbon alloy layer by selective epitaxy.

* * * * *